(12) United States Patent
Chia et al.

(10) Patent No.: US 12,027,412 B2
(45) Date of Patent: Jul. 2, 2024

(54) THREE-DIMENSIONAL MEMORY DEVICE AND METHOD

(71) Applicant: Taiwan Semiconductor Manufacturing Co., Ltd., Hsinchu (TW)

(72) Inventors: Han-Jong Chia, Hsinchu (TW); Meng-Han Lin, Hsinchu (TW); Sheng-Chen Wang, Hsinchu (TW); Feng-Cheng Yang, Zhudong Township (TW); Chung-Te Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 100 days.

(21) Appl. No.: 17/814,626

(22) Filed: Jul. 25, 2022

(65) Prior Publication Data
US 2022/0359270 A1 Nov. 10, 2022

Related U.S. Application Data

(62) Division of application No. 16/951,595, filed on Nov. 18, 2020, now Pat. No. 11,587,823.
(Continued)

(51) Int. Cl.
*H01L 21/762* (2006.01)
*G11C 7/18* (2006.01)
(Continued)

(52) U.S. Cl.
CPC .......... *H01L 21/76237* (2013.01); *G11C 7/18* (2013.01); *H10B 51/20* (2023.02); *H10B 99/00* (2023.02)

(58) Field of Classification Search
CPC ......... H01L 21/76237; H01L 29/78391; H01L 29/40111; H01L 29/6684; G11C 7/18;
(Continued)

(56) References Cited

U.S. PATENT DOCUMENTS 9,728,546 B2 8/2017 Serov et al.
10,424,598 B2 9/2019 Liu et al.
(Continued)

FOREIGN PATENT DOCUMENTS

CN 109698162 A 4/2019
CN 109786390 A 5/2019
(Continued)

*Primary Examiner* — Thanhha S Pham
(74) *Attorney, Agent, or Firm* — Slater Matsil, LLP

(57) ABSTRACT

A method of forming a three-dimensional (3D) memory device includes: forming a layer stack over a substrate, the layer stack including alternating layers of a first dielectric material and a second dielectric material; forming trenches extending through the layer stack; replacing the second dielectric material with an electrically conductive material to form word lines (WLs); lining sidewalls and bottoms of the trenches with a ferroelectric material; filling the trenches with a third dielectric material; forming bit lines (BLs) and source lines (SLs) extending vertically through the third dielectric material; removing portions of the third dielectric material to form openings in the third dielectric material between the BLs and the SLs; forming a channel material along sidewalls of the openings; and filling the openings with a fourth dielectric material.

20 Claims, 28 Drawing Sheets

Related U.S. Application Data

(60) Provisional application No. 63/045,274, filed on Jun. 29, 2020.

(51) Int. Cl.
*H10B 51/20* (2023.01)
*H10B 99/00* (2023.01)

(58) Field of Classification Search
CPC ........ H10B 51/20; H10B 99/00; H10B 51/40; H10B 51/10; H10B 51/30
See application file for complete search history.

(56) References Cited

U.S. PATENT DOCUMENTS

| | | |
|---|---|---|
| 10,777,578 B2 | 9/2020 | Liu |
| 11,107,829 B2 | 8/2021 | Kwon et al. |
| 2014/0048868 A1 | 2/2014 | Kim et al. |
| 2016/0163389 A1 | 6/2016 | Zhang et al. |
| 2018/0358380 A1 | 12/2018 | Yoo |
| 2019/0355745 A1 | 11/2019 | Sun et al. |
| 2020/0020717 A1* | 1/2020 | Lee .................. H10B 43/27 |
| 2020/0119047 A1 | 4/2020 | Yoo et al. |
| 2020/0168630 A1 | 5/2020 | Borukhov |
| 2020/0194441 A1 | 6/2020 | Kwon et al. |

FOREIGN PATENT DOCUMENTS

| | | |
|---|---|---|
| CN | 111326524 A | 6/2020 |
| KR | 20140024632 A | 3/2014 |
| KR | 20170048393 A | 5/2017 |
| KR | 20200074573 A | 6/2020 |

\* cited by examiner

THREE-DIMENSIONAL MEMORY DEVICE AND METHOD

PRIORITY CLAIM AND CROSS-REFERENCE

This application is a divisional of U.S. patent application Ser. No. 16/951,595, filed Nov. 18, 2020, entitled "Three-Dimensional Memory Device and Method," which claims the benefit of U.S. Provisional Application No. 63/045,274, filed on Jun. 29, 2020, which applications are hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them without power being supplied. One type of non-volatile semiconductor memory is ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
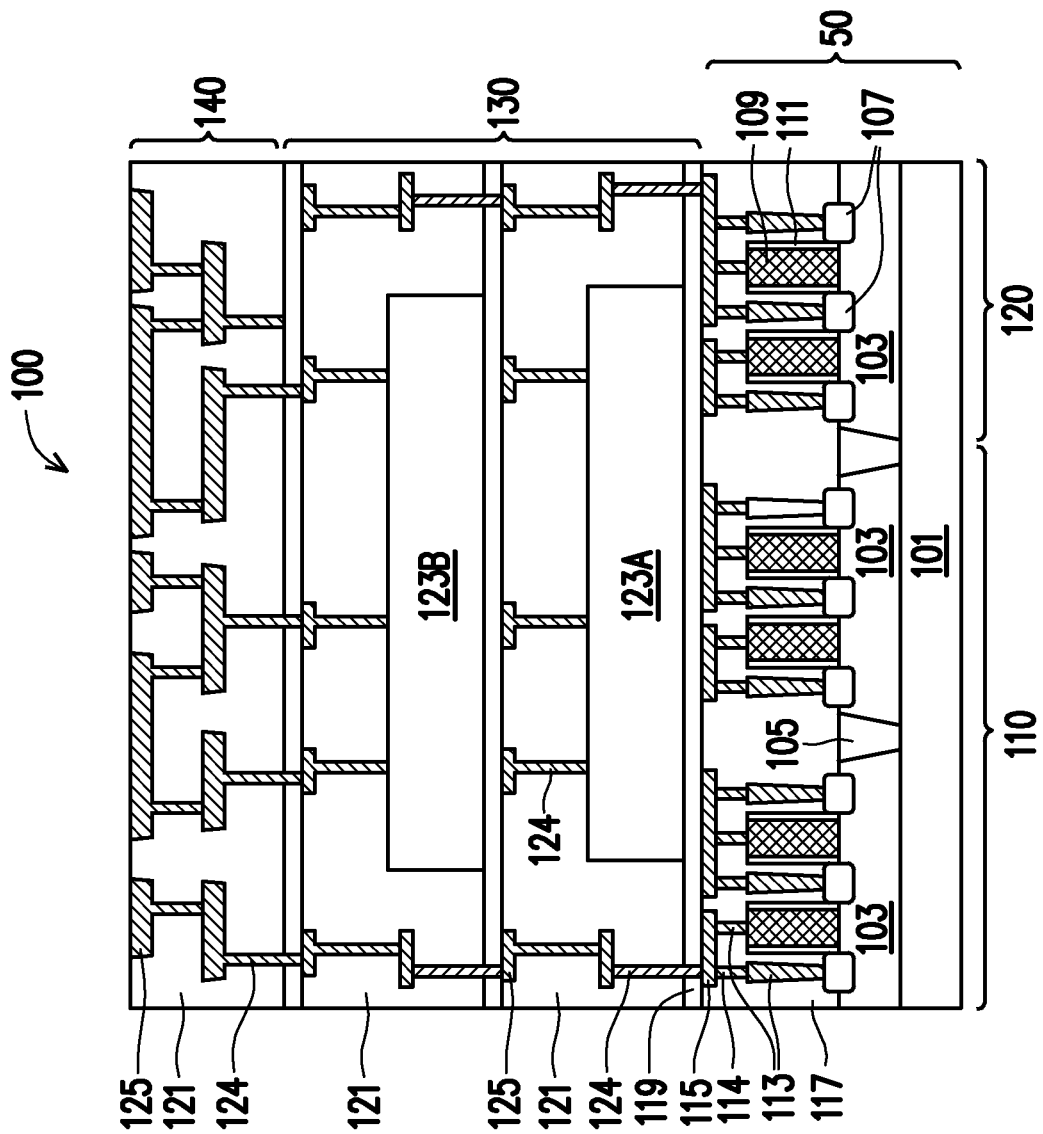
FIG. 1 illustrates a cross-sectional view of a semiconductor device with integrated memory devices, in an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numeral in different figures refers to the same or similar element formed by a same or similar process using a same or similar material(s).

In some embodiments, a channel-last method for forming a three-dimensional (3D) memory device includes: forming a layer stack over a substrate, the layer stack comprising alternating layers of a first dielectric material and a second dielectric material; forming trenches extending through the layer stack; replacing the second dielectric material with an electrically conductive material to form word lines (WLs); lining sidewalls and bottoms of the trenches with a ferroelectric material; filling the trenches with a third dielectric material; forming bit lines (BLs) and source lines (SLs) extending through the third dielectric material; removing portions of the third dielectric material disposed between respective BLs and SLs to form openings in the third dielectric material; forming a channel material along sidewalls of the openings; and filling the openings with a fourth dielectric material.

FIG. 1 illustrates a cross-sectional view of a semiconductor device 100 with integrated memory devices 123 (e.g., 123A and 123B), in an embodiment. The semiconductor device 100 is a fin-field effect transistor (FinFET) device with three-dimensional (3D) ferroelectric random access memory (FeRAM) devices 123 integrated in the back-end-of-line (BEOL) processing of semiconductor manufacturing, in the illustrated embodiment. Note that FinFETs are used as a non-limiting example here. The FeRAM devices 123 may be integrated in any suitable devices, such as semiconductor devices with planar transistors or gate-all-around (GAA) transistors. To avoid clutter, details of the memory devices 123 are not shown in FIG. 1, but are illustrated in subsequent figures hereinafter.

As illustrated in FIG. 1, the semiconductor device 100 includes different regions for forming different types of circuits. For example, the semiconductor device 100 may include a first region 110 for forming logic circuits, and may include a second region 120 for forming, e.g., peripheral circuits, input/output (I/O) circuits, electrostatic discharge (ESD) circuits, and/or analog circuits. Other regions for forming other types of circuits are possible and are fully intended to be included within the scope of the present disclosure.

The semiconductor device 100 includes a substrate 101. The substrate 101 may be a bulk substrate, such as a silicon substrate, doped or undoped, or an active layer of a semiconductor-on-insulator (SOI) substrate. The substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Electrical components, such as transistors, resistors, capacitors, inductors, diodes, or the like, are formed in or on the substrate 101 in the front-end-of-line (FEOL) processing of semiconductor manufacturing. In the example of FIG. 1, semiconductor fins 103 (also referred to as fins) are formed protruding above the substrate 101. Isolation regions 105, such as shallow-trench isolation (STI) regions, are formed between or around the semiconductor fins 103. Gate electrodes 109 are formed over the semiconductor fins 103. Gate spacers 111 are formed along sidewalls of the gate electrodes 109. Source/drain regions 107, such as epitaxial source/drain regions, are formed on opposing sides of the gate electrodes 109. Contacts 113, such as gate contacts and source/drain contacts, are formed over and electrically coupled to respective underlying electrically conductive features (e.g., gate electrodes 109 or source/drain regions 107). One or more dielectric layers 117, such as an inter-layer dielectric (ILD) layer, is formed over the substrate 101 and around the semiconductor fins 103 and the gate electrodes 109. Other electrically conductive features, such as interconnect structures comprising conductive lines 115 and vias 114, may also be formed in the one or more dielectric layers 117. The FinFETs in FIG. 1 may be formed by any suitable method known or used in the art, details are not repeated here. For ease of discussion herein, the substrate 101, the electrical components (e.g., FinFETs) formed in/on the substrate 101, the contacts 113, conductive features 115/114, and the one or more dielectric layers 117 are collectively referred to as substrate 50.

Still referring to FIG. 1, a dielectric layer 119, which may be an etch stop layer (ESL), is formed over the one or more dielectric layers 117. In an embodiment, the dielectric layer 119 is formed of silicon nitride using plasma-enhanced physical vapor deposition (PECVD), although other dielectric materials such as nitride, carbide, combinations thereof, or the like, and alternative techniques of forming the dielectric layer 119, such as low-pressure chemical vapor deposition (LPCVD), PVD, or the like, could alternatively be used. In some embodiments, the dielectric layer 119 is omitted. Next, a dielectric layer 121 is formed over the dielectric layer 119. The dielectric layer 121 may be any suitable dielectric material, such as silicon oxide, silicon nitride, or the like, formed by a suitable method, such as PVD, CVD, or the like. One or more memory device 123A, each of which includes a plurality of memory cells, are formed in the dielectric layer 121 and coupled to electrically conductive features (e.g., vias 124 and conductive lines 125) in the dielectric layer 121. Various embodiments of the memory devices 123A or 123B in FIG. 1 (e.g., 3D memory devices 200, 200A, and 200B) are discussed hereinafter in details.

FIG. 1 further illustrates a second layer of memory devices 123B formed over the memory devices 123A. The memory devices 123A and 123B may have a same or similar structure, and may be collectively referred to as memory devices 123. The example of FIG. 1 illustrates two layers of memory devices 123 as a non-limiting example. Other numbers of layers of memory devices 123, such as one layer, three layers, or more, are also possible and are fully intended to be included within the scope of the present disclosure. The one or more layers of memory device 123 are formed in a memory region 130 of the semiconductor device 100, and may be formed in the back-end-of-line (BEOL) processing of semiconductor manufacturing. The memory devices 123 may be formed in the BEOL processing at any suitable locations within the semiconductor device 100, such as over (e.g., directly over) the first region 110, over the second region 120, or over a plurality of regions.

Still referring to FIG. 1, after the memory region 130 is formed, an interconnect structure 140, which includes dielectric layer 121 and electrically conductive features (e.g., vias 124 and conductive lines 125) in the dielectric layer 121, is formed over the memory region 130. The interconnect structure 140 may electrically connect the electrical components formed in/on the substrate 101 to form functional circuits. The interconnect structure 140 may also electrically couple the memory devices 123 to the components formed in/on the substrate 101, and/or couple the memory devices 123 to conductive pads formed over the interconnect structure 140 for connection with an external circuit or an external device. Formation of interconnect structure is known in the art, thus details are not repeated here.

In some embodiments, the memory devices 123 are electrically coupled to the electrical components (e.g., transistors) formed on the substrate 50, e.g., by the vias 124 and conductive lines 125, and are controlled or accessed (e.g., written to or read from) by functional circuits of the semiconductor device 100, in some embodiments. In addition, or alternatively, the memory devices 123 are electrically coupled to conductive pads formed over a top metal layer of the interconnect structure 140, in which case the memory devices 123 may be controlled or accessed by an external circuit (e.g., another semiconductor device) directly without involvement of the functional circuits of the semiconductor device 100, in some embodiments. Although additional metal layers (e.g., the interconnect structure 140) are formed over the memory devices 123 in the example of FIG. 1, the memory devices 123 may be formed in a top (e.g., topmost) metal layer of the semiconductor device 100, these and other variations are fully intended to be included within the scope of the present disclosure.

FIGS. 2-18 and 19A-19F illustrate various views (perspective view, cross-sectional view, top view) of a three-dimensional (3D) ferroelectric random access memory (FeRAM) device 200 at various stages of manufacturing, in an embodiment. For ease of discussion, a 3D FeRAM device may also be referred to as a 3D memory device, or simply a memory device in the discussion herein. The 3D memory device 200 is a three-dimensional memory device with a ferroelectric material. The 3D memory device 200 may be used as the memory device 123A and/or 123B in FIG. 1. Note that for simplicity, not all features of the 3D memory device 200 are illustrated in the figures.

Figure 2:
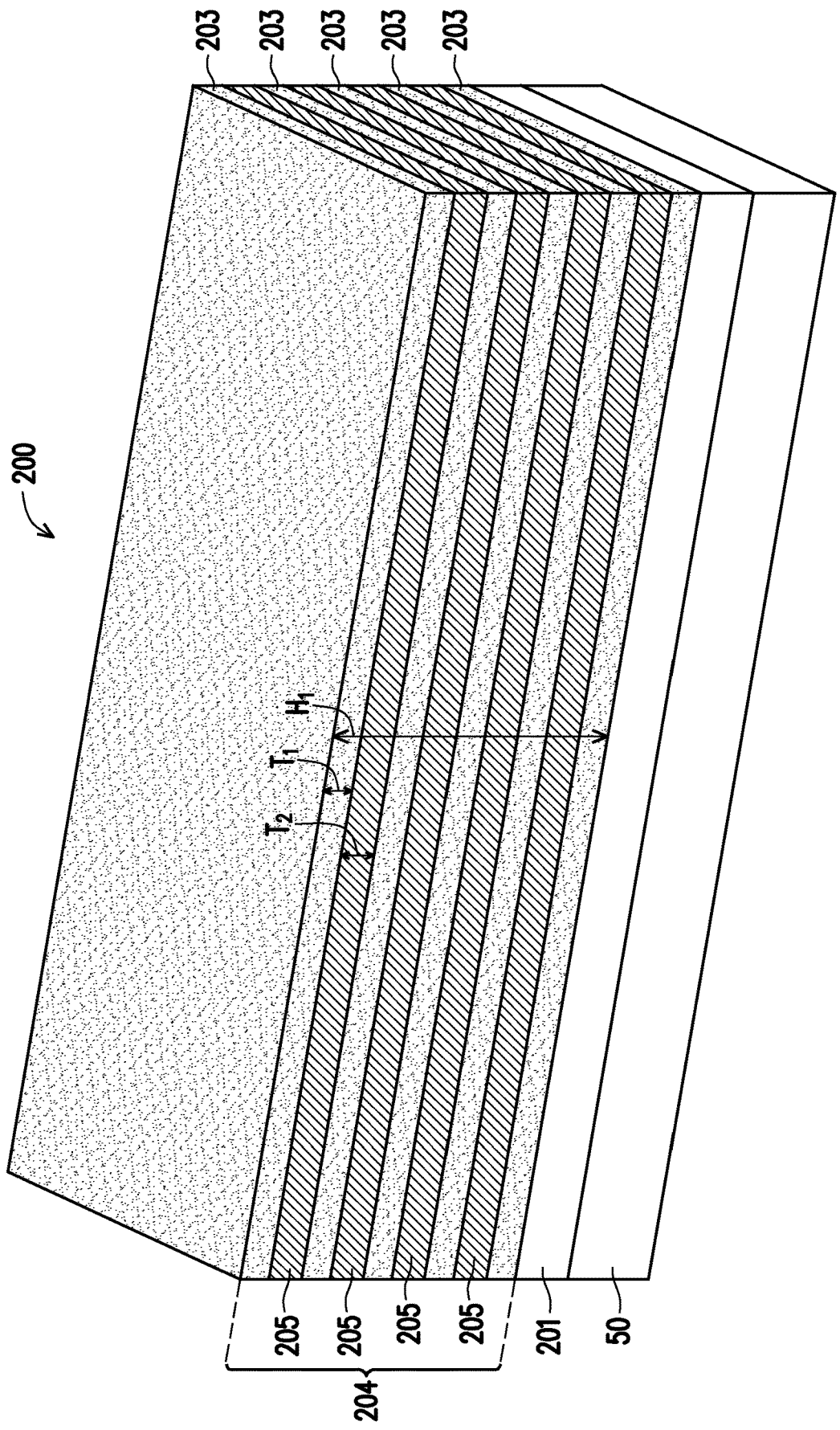
FIGS. 2-18 and 19A-19F illustrate various views of a three-dimensional (3D) ferroelectric random access memory (FeRAM) device at various stages of manufacturing, in an embodiment.

In FIG. 2, a dielectric layer 201 (may also be referred to as a glue layer) is formed over the substrate 50, and a multilayer stack 204 (may also be referred to as a layer stack) is formed over the dielectric layer 201. Note that the substrate 50 is illustrated in FIG. 2 to show the location of the 3D memory device 200 relative to the substrate 50, and the substrate 50 may not be considered part of the 3D memory device 200. In addition, not all features of the 3D memory device 200 are illustrated. For example, the dielectric layer 119 (see FIG. 1) over the substrate 50 is not illustrated in FIG. 2. For simplicity, the substrate 50 is not illustrated in subsequent figures.

In some embodiments, the dielectric layer 201 comprises a suitable material, such as a dielectric material different from the materials of the multilayer stack 204, in order to provide etching selectivity. In the illustrated embodiment, the dielectric layer 201 functions as an etch stop layer for subsequent etching processes to form first trenches 206 (see FIG. 3) and second trenches 212 (see FIG. 9). The dielectric layer 201 may comprise a suitable dielectric material, such as silicon carbide (SiC), and may be formed by a suitable formation method such as atomic layer deposition (ALD), sputtering, physical vapor deposition (PVD), chemical vapor deposition (CVD), or the like.

The multilayer stack 204 includes alternating first dielectric layers 203 and second dielectric layers 205. The first dielectric layers 203 are formed of a first dielectric material, and the second dielectric layers 205 are formed of a second dielectric material different from the first dielectric material to provide etching selectivity. The dielectric materials for forming the first dielectric layers 203 and the second dielectric layers 205 include oxides such as silicon oxide; nitrides such as silicon nitride; carbides such as silicon carbide; the like; or combinations thereof such as silicon oxynitride, silicon oxycarbide, silicon carbonitride, or the like. A suitable formation method, such as CVD, PVD, ALD, or the like, may be used to form the first dielectric layers 203 and the second dielectric layers 205. In the illustrated embodiment, the multilayer stack 204 includes five layers of the first dielectric layers 203 and four layers of the second dielectric layers 205. It should be appreciated that the multilayer stack 204 may include any suitable number of the first dielectric layers 203 and the second dielectric layers 205.

The multilayer stack 204 will be patterned in subsequent processing. As such, the dielectric materials of the first dielectric layers 203 and the second dielectric layers 205 both have a high etching selectivity from the etching of the dielectric layer 201. The patterned first dielectric layers 203 will be used to isolate subsequently formed memory cells. The patterned second dielectric layers 205 are sacrificial layers (or dummy layers), which will be removed in subsequent processing and replaced with word lines for the memory cells. As such, the second dielectric material of the second dielectric layers 205 also has a high etching selectivity from the first dielectric material of the first dielectric layers 203. In embodiments where the dielectric layer 201 is formed of titanium nitride, the first dielectric layers 203 may be formed of an oxide such as silicon oxide, and the second dielectric layers 205 may be formed of a nitride such as silicon nitride. Other combinations of dielectric materials having acceptable etching selectivity from one another may also be used.

A thickness of each of the layers in the layer stack 204 may be in the range of about 15 nm to about 90 nm. In some embodiments, the first dielectric layers 203 are formed to a different thickness than the second dielectric layers 205. For example, the first dielectric layers 203 may be formed to a first thickness $T_1$ and the second dielectric layers 205 may be formed to a second thickness $T_2$, with the second thickness $T_2$ being from about 0% to about 100% greater than or less than the first thickness $T_1$. The layer stack 104 may have an overall height $H_1$ in the range of about 1000 nm to about 10000 nm.

Figure 3:
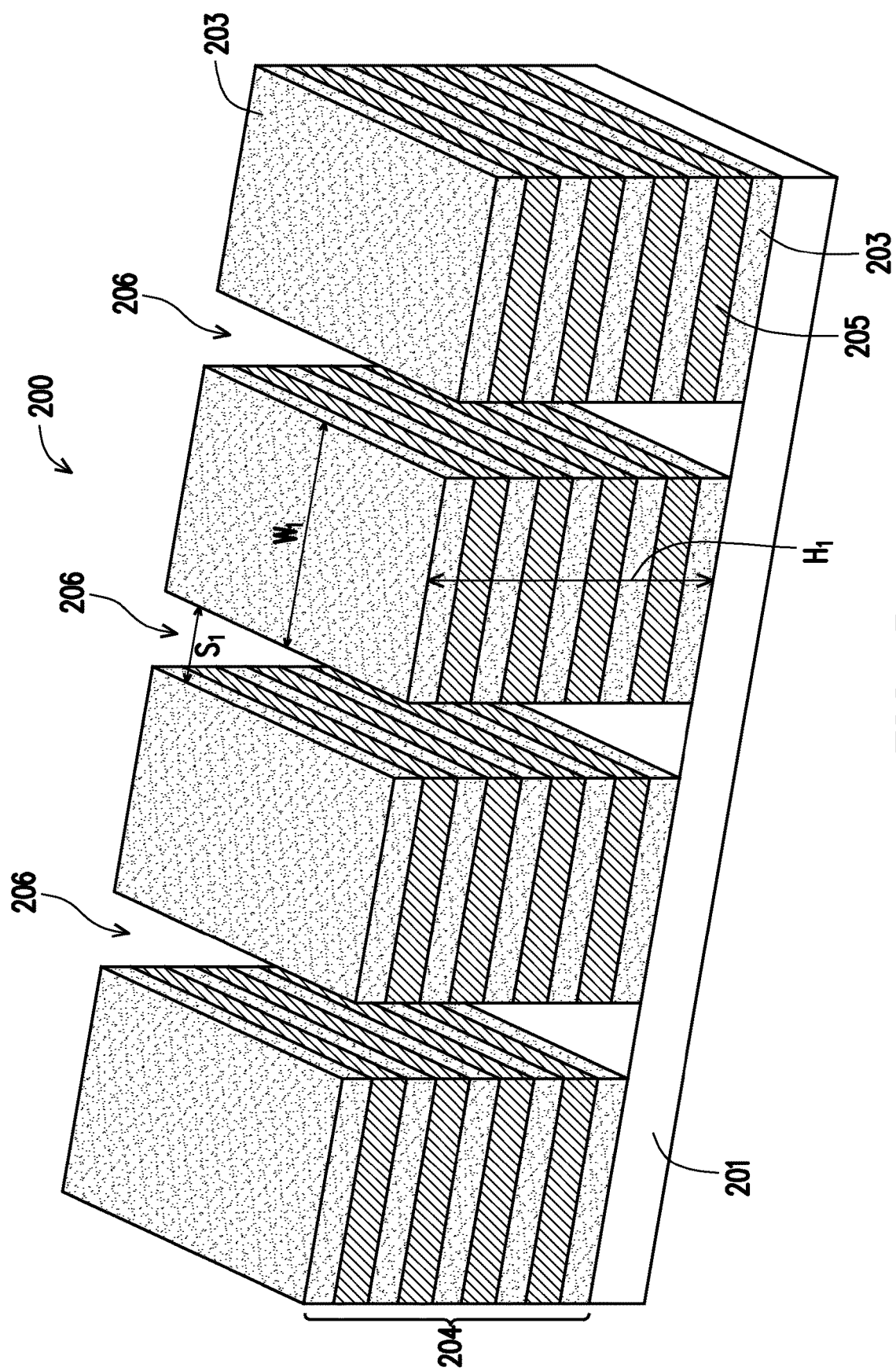

Next, in FIG. 3, first trenches 206 are formed in the multilayer stack 204. In the illustrated embodiment, the first trenches 206 extend through the multilayer stack 204 and expose the dielectric layer 201. The first trenches 206 may be formed using acceptable photolithography and etching techniques, such as with an etching process that is selective to the multilayer stack 204 (e.g., etches the dielectric materials of the first dielectric layers 203 and the second dielectric layers 205 at a faster rate than the material of the dielectric layer 201). The etching may be any acceptable etch process, such as a reactive ion etch (RIE), neutral beam etch (NBE), the like, or a combination thereof. The etching may be anisotropic. In embodiments where the dielectric layer 201 is formed of silicon carbide, the first dielectric layers 203 are formed of silicon oxide, and the second dielectric layers 205 are formed of silicon nitride, the first trenches 206 may be formed by a dry etch using a fluorine-based gas (e.g., $C_4F_6$) mixed with hydrogen ($H_2$) or oxygen ($O_2$) gas.

A portion of the multilayer stack 204 is disposed between each pair of the first trenches 206. Each portion of the multilayer stack 204 can have a width $W_1$ in the range of about 50 nm to about 500 nm, and has the height $H_1$ discussed with respect to FIG. 2. Further, each portion of the multilayer stack 204 is separated by a separation distance $S_1$, which can be in the range of about 50 nm to about 200 nm. The aspect ratio (AR) of each portion of the multilayer stack 204 is the ratio of the height $H_1$ to the width of the narrowest feature of the portion of the multilayer stack 204, which is the width $W_1$ at this step of processing. In accordance with some embodiment, when the first trenches 206 are formed, the aspect ratio of each portion of the multilayer stack 204 is in the range of about 5 to about 15. Forming each portion of the multilayer stack 204 with an aspect ratio of less than about 5 may not allow the memory array to have sufficient memory cell density. Forming each portion of the multilayer stack 204 with an aspect ratio of greater than about 15 may cause twisting or collapsing of the multilayer stack 204 in subsequent processing.

Figure 4:
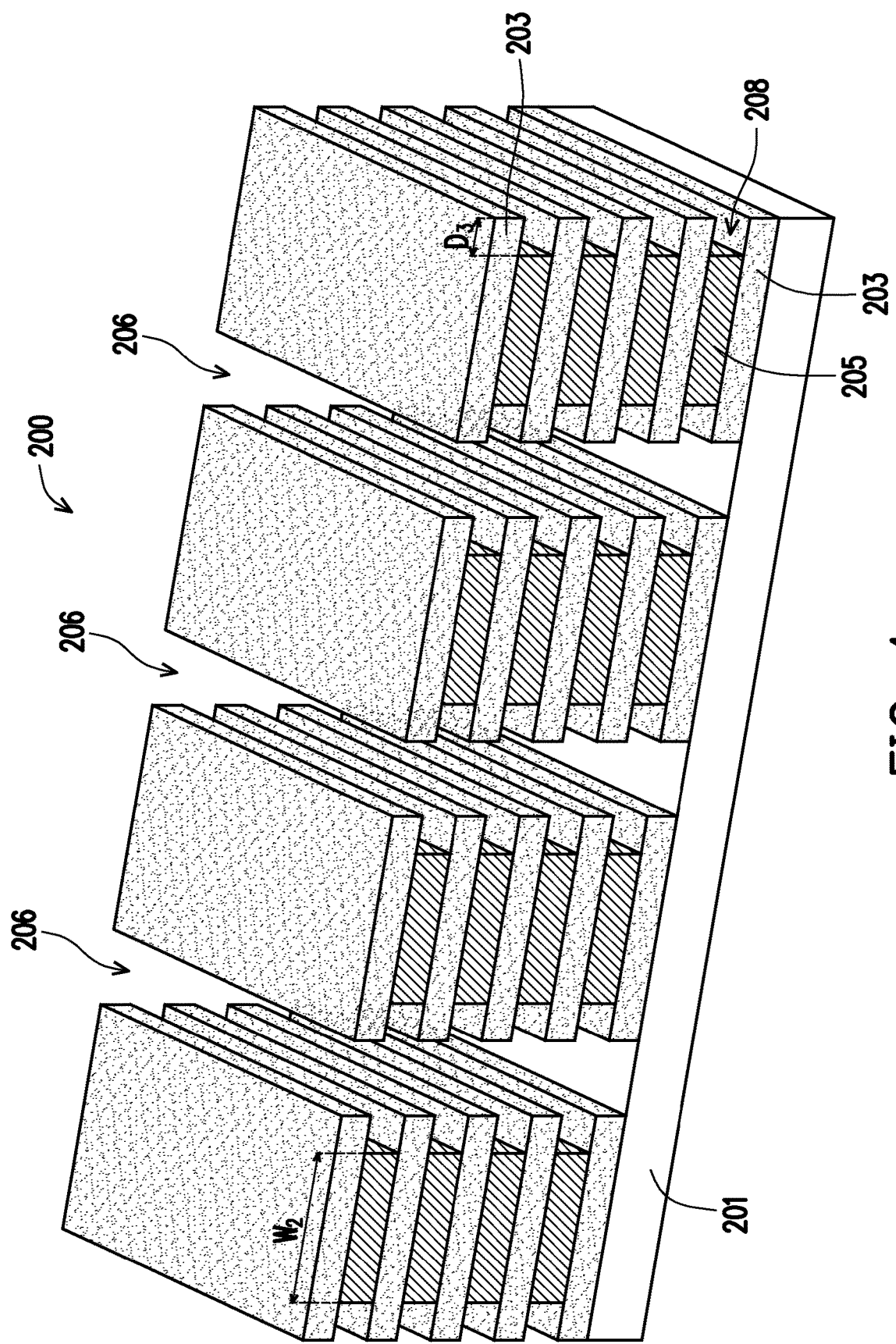

Next, In FIG. 4, sidewalls of the second dielectric layers 205 exposed by the first trenches 206 are recessed from sidewalls of the first dielectric layers 203 to form first sidewall recesses 208. Although sidewalls of the second dielectric layers 205 are illustrated as being straight, the sidewalls may be concave or convex. The first sidewall recesses 208 may be formed by an acceptable etching process, such as one that is selective to the material of the second dielectric layers 205 (e.g., selectively etches the material of the second dielectric layers 205 at a faster rate than the materials of the first dielectric layers 203 and the dielectric layer 201). The etching may be isotropic. In embodiments where the dielectric layer 201 is formed of silicon carbide, the first dielectric layers 203 are formed of silicon oxide, and the second dielectric layers 205 are formed of silicon nitride, a wet etch using phosphoric acid ($H_3PO_4$) may be performed to form the first sidewall recesses 208. In another embodiment, a dry etch selective to the material of the second dielectric layers 205 may be used.

After formation, the first sidewall recesses 208 have a depth $D_3$ extending past the sidewalls of the first dielectric layers 203. Timed etch processes may be used to stop the etching of the first sidewall recesses 208 after the first sidewall recesses 208 reach a target depth $D_3$. For example, the first sidewall recesses 208 can have a depth $D_3$ in the range of about 10 nm to about 60 nm. Forming the first sidewall recesses 208 reduces the width of the second dielectric layers 205. Continuing the previous example, the second dielectric layers 205 may have a width $W_2$ in the range of about 50 nm to about 450 nm after the etching. As noted above, the aspect ratio (AR) of each portion of the multilayer stack 204 is the ratio of the height $H_1$ to the width of the narrowest feature of the portion of the multilayer stack 204, which is the width $W_2$ at this step of processing. Forming the first sidewall recesses 208 thus increases the aspect ratio of each portion of the multilayer stack 204. In accordance with some embodiment, after forming the first sidewall recesses 208, the aspect ratio of each portion of the multilayer stack 204 remains in the range discussed above, e.g., the range of about 5 to about 15. The advantages of such an aspect ratio (discussed above) may thus still be achieved.

Figure 5:
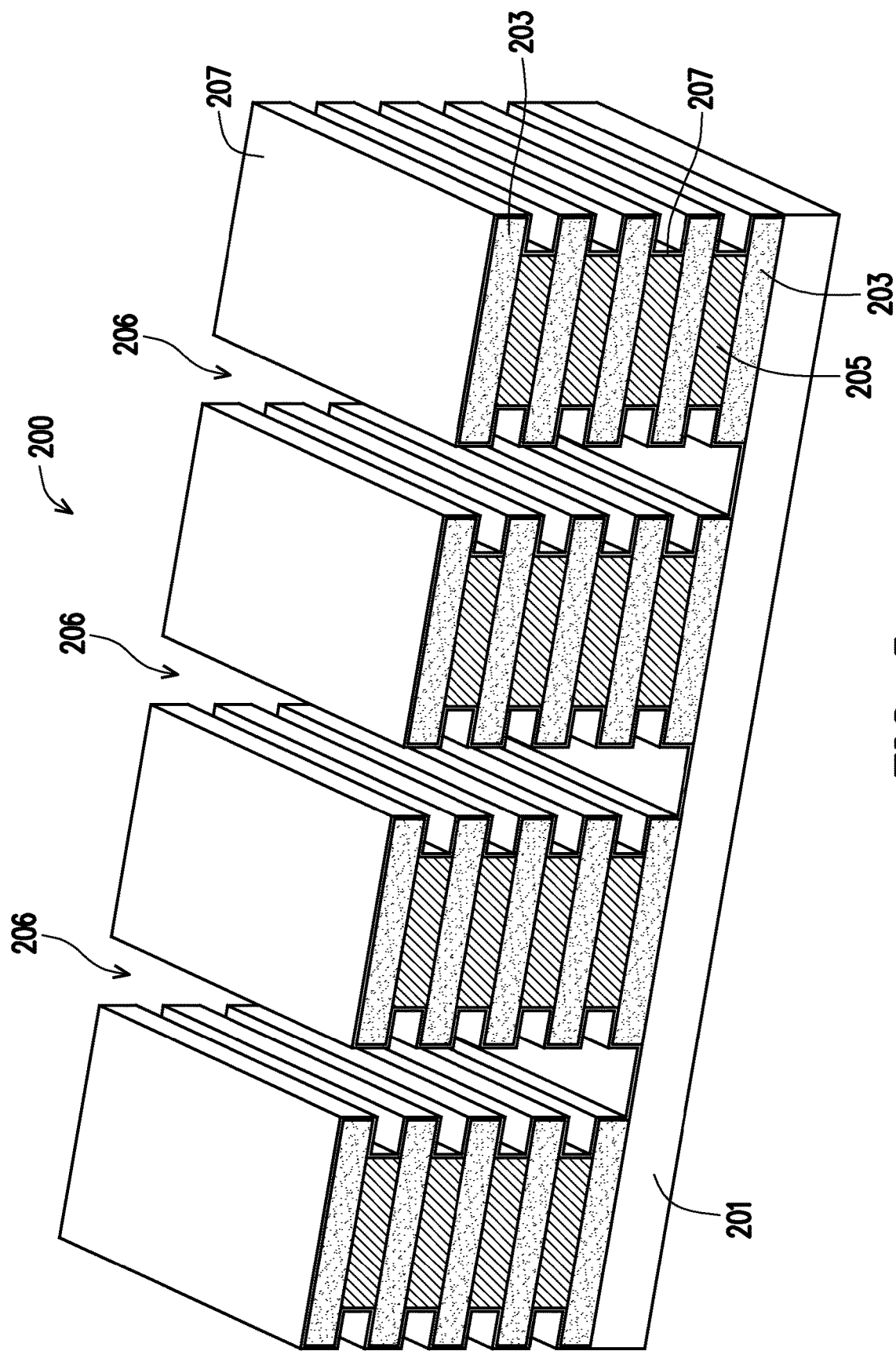

Next, in FIG. 5, a seed layer 207 is formed (e.g., conformally) over exposed surfaces of the dielectric layer 201, the first dielectric layers 203, and the second dielectric layers 205. In some embodiments, the seed layer 207 is formed of a conductive (e.g., electrically conductive) material such as a metal nitride, e.g., titanium nitride, tantalum nitride, molybdenum nitride, zirconium nitride, hafnium nitride, or the like, and may be formed using CVD, ALD, or the like.

Figure 6:
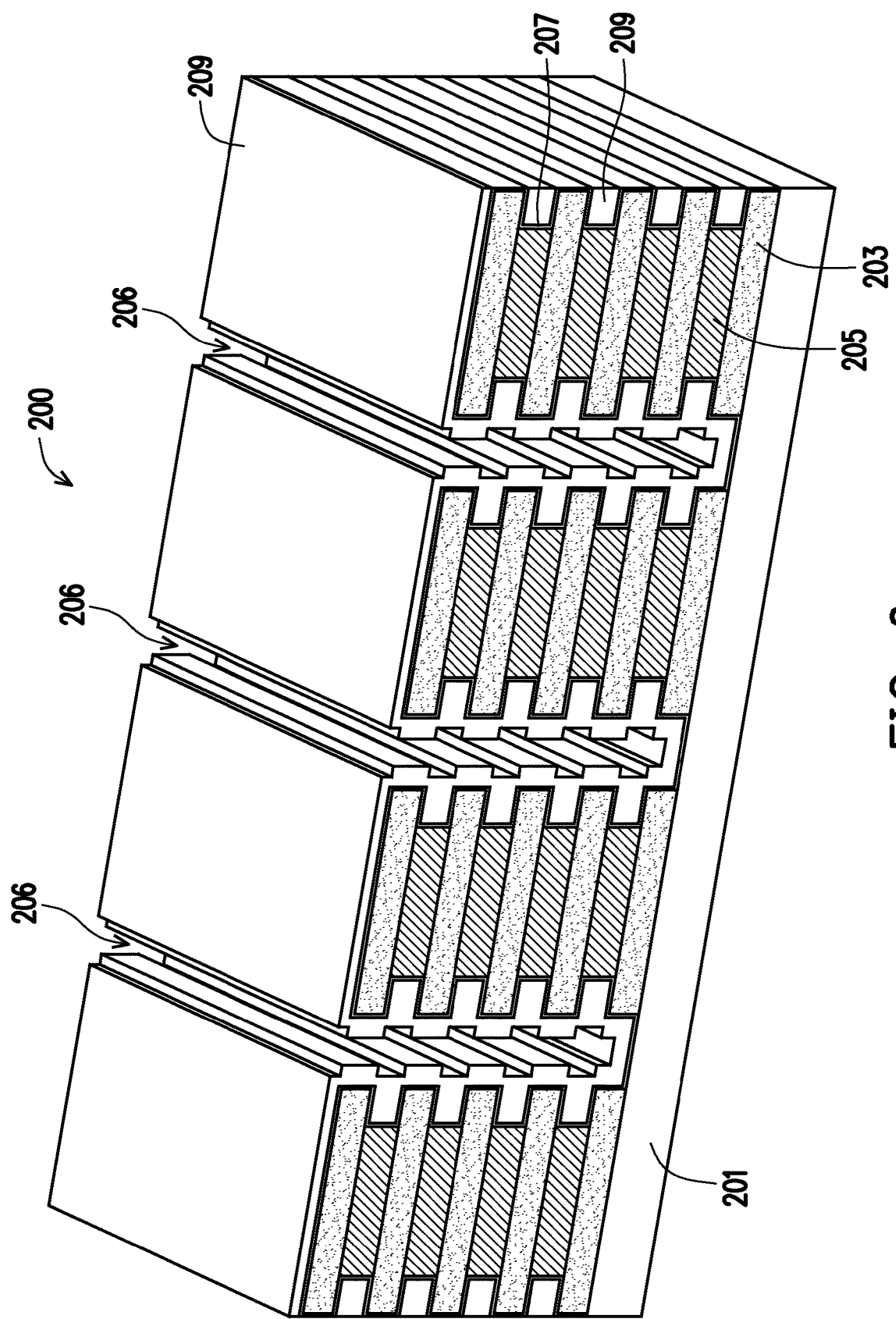

Next, in FIG. 6, an electrically conductive material 209, such as a metal, such as tungsten, ruthenium, molybdenum, cobalt, aluminum, nickel, copper, silver, gold, alloys thereof, or the like, is formed over the seed layer 207. The electrically conductive material 209 fills the first sidewall recesses 208. The electrically conductive material 209 may be formed by a suitable deposition method, such as CVD, PVD, ALD, or the like.

Figure 7:
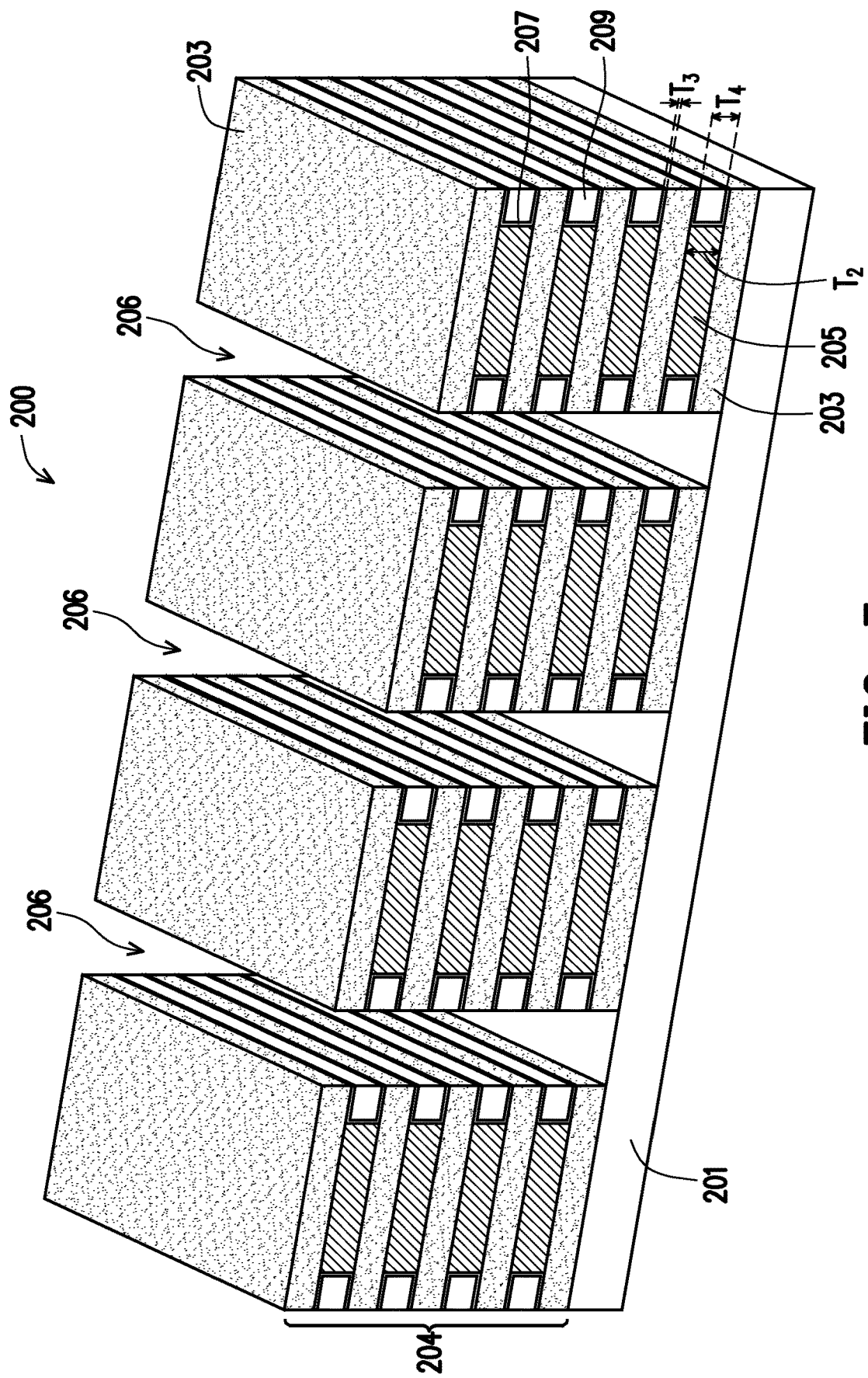

Next, in FIG. 7, a suitable etching process, such as a dry etch (e.g., a reactive ion etch (RIE), neutral beam etch (NBE), the like), a wet etch, the like, or a combination thereof, may be performed to remove excess materials from, e.g., the sidewalls of the first dielectric layers 203 and the upper surface of the dielectric layer 201. The etching process is an anisotropic etching process, in the illustrated embodiment. After the etching process (e.g., an anisotropic etching process), portions of the seed layer 207 and portions of the electrically conductive material 209 disposed within lateral extents of the first dielectric layers 203 (e.g., portions disposed in the first sidewall recesses 208) remain to form first conductive features 210A, and other portions of the seed layer 207 and the electrically conductive material 209 (e.g., portions disposed outside the first sidewall recesses 208) are removed by the etching process. As illustrated in FIG. 7, after the etching process, the seed layer 207 extends along three sides (e.g., the top surface, a sidewall, and the bottom surface) of a corresponding portion of the electrically conductive material 209.

In the illustrated embodiment, the first conductive features 210A have a same or similar overall thickness $T_2$ as the second dielectric layers 205, and have a same or similar overall width as the depth $D_3$ of the first sidewall recesses 208 (discussed above with reference to FIG. 4). The seed layer 207 may have a thickness $T_3$ in the range of about 1 nm to about 10 nm, and the electrically conductive material 209 of each of the first conductive features 210A may have a thickness $T_4$ in the range of about, e.g., 14 nm to about 89 nm, with the thickness $T_4$ being greater than the thickness $T_3$.

In FIG. 7, the first conductive features 210A are formed in the first sidewall recesses 208, thus completing a process for replacing first portions of the second dielectric layers 205. In subsequent processing, the remaining portions of the second dielectric layers 205 are replaced by second conductive features 210B, as discussed below with reference to FIGS. 9-12.

Figure 8:
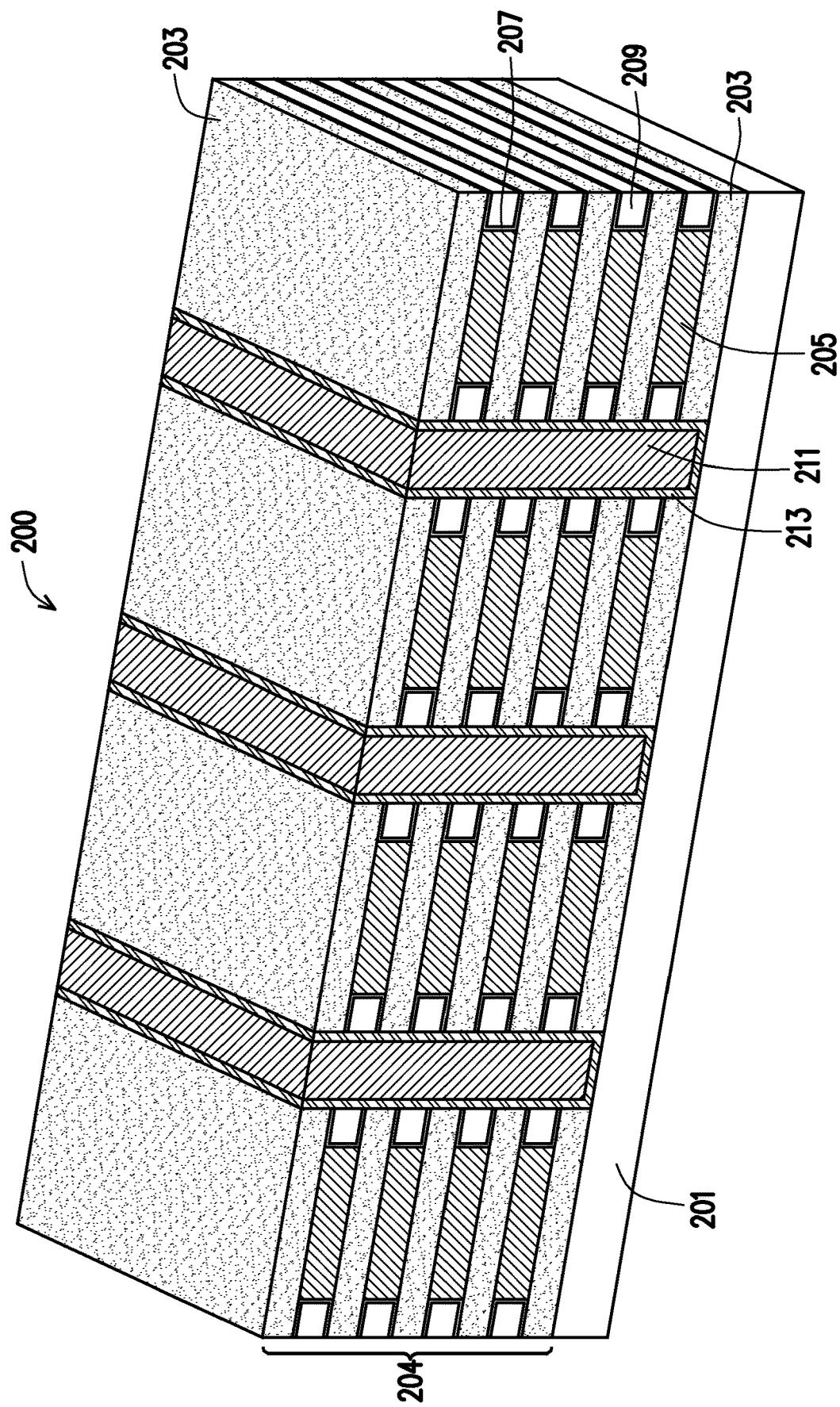

Next, in FIG. 8, a ferroelectric film 213 is formed (e.g., conformally) to line sidewalls and bottoms of the first trenches 206, and a dielectric layer 211 is formed over the ferroelectric film 213 to fill the first trenches 206.

In some embodiments, the ferroelectric film 213 is formed of a suitable ferroelectric material, such as hafnium zirconium oxide (HfZrO); zirconium oxide (ZrO); hafnium oxide (HfO) doped with lanthanum (La), silicon (Si), aluminum (Al), or the like; undoped hafnium oxide (HfO); or the like. The material of the ferroelectric film 213 may be formed by a suitable deposition process such as ALD, CVD, PVD, or the like.

The dielectric layer 211 is formed of a dielectric material. Acceptable dielectric materials include oxides such as silicon oxide or aluminum oxide; nitrides such as silicon nitride; carbides such as silicon carbide; the like; or combinations thereof such as silicon oxynitride, silicon oxycarbide, silicon carbonitride, or the like. The material of the dielectric layers 211 may be formed by an acceptable deposition process such as ALD, CVD, flowable CVD (FCVD), or the like.

Next, a planarization process, such as chemical mechanical planarization (CMP), may be performed to remove excess portions of the ferroelectric film 213 and excess portions of the dielectric layer 211 from the upper surface of the multilayer stack 204. As a result, a coplanar upper surface is achieved between the multilayer stack 204, the ferroelectric film 213, and the dielectric layer 211.

Figure 9:
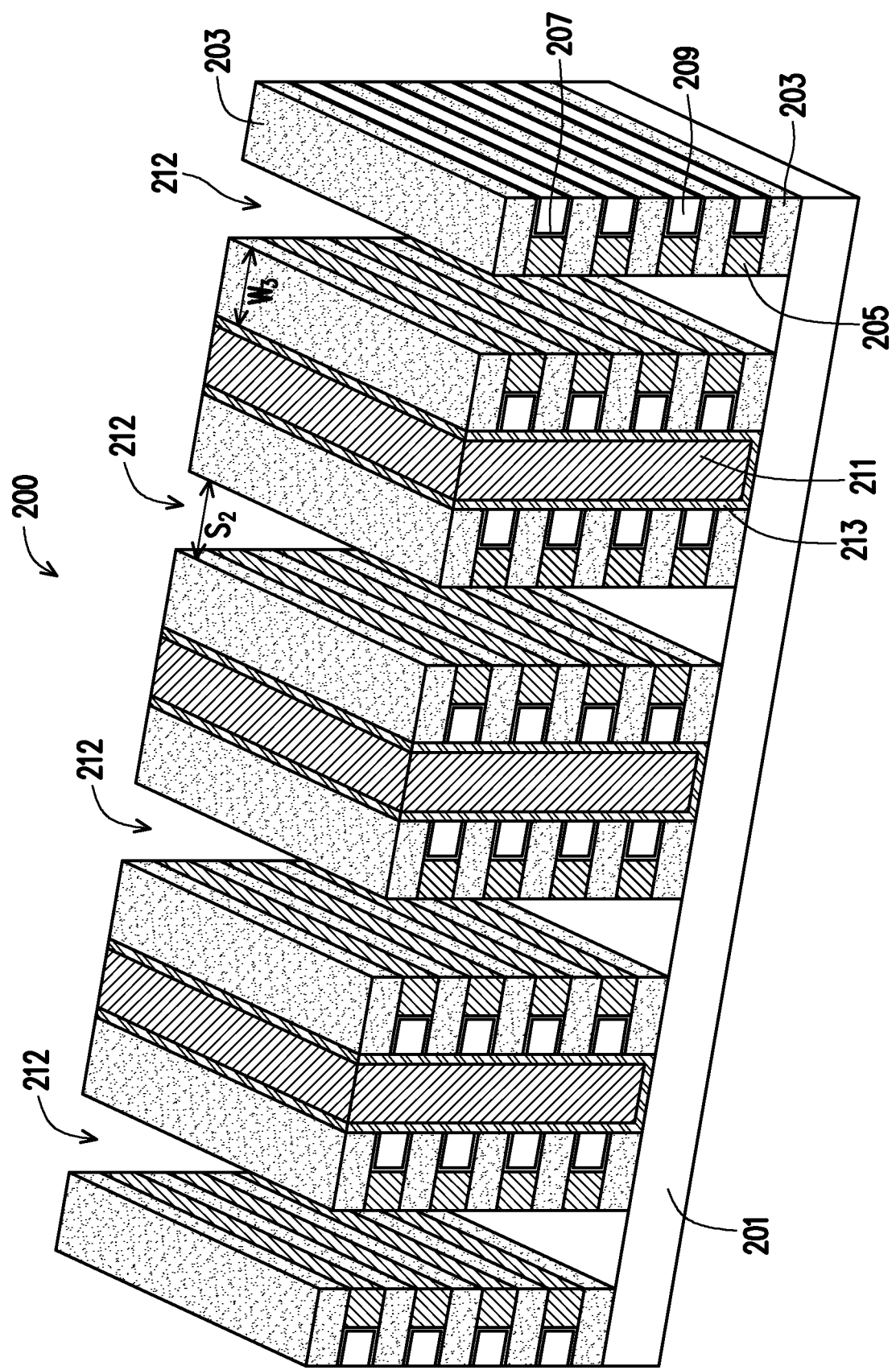

Next, in FIG. 9, second trenches 212 are formed in the multilayer stack 204. In the illustrated embodiment, the second trenches 212 extend through the multilayer stack 204 and expose the dielectric layer 201. The second trenches 212 may be formed using a same or similar processing as the first trenches 206, thus details are not repeated. As illustrated in FIG. 9, the second trenches 212 are formed to extend through the remaining portions of the second dielectric layers 205, such that the second trenches 212 are interleaved with the first trenches 206 (which are now filled by the ferroelectric film 213 and the dielectric layer 211).

In FIG. 9, a portion of the multilayer stack 204 is disposed between a second trench 212 and a respective first trench 206. Each portion of the multilayer stack 204 may have a width $W_3$ in the range of about 50 nm to about 500 nm, and has the height $H_1$ (see FIG. 3). Further, each portion of the multilayer stack 204 is separated by a separation distance $S_2$, which may be in the range of about 50 nm to about 200 nm. The aspect ratio (AR) of each portion of the multilayer stack 204 is the ratio of the height $H_1$ to the width of the narrowest feature of the portion of the multilayer stack 204, which is the width $W_3$ at this step of processing. In accordance with some embodiment, when the second trenches 212 are formed, the aspect ratio of each portion of the multilayer stack 204 is in the range of about 5 to about 15. Forming each portion of the multilayer stack 204 with an aspect ratio of less than about 5 may not allow the memory array formed subsequently to have sufficient memory cell density. Forming each portion of the multilayer stack 204 with an aspect ratio of greater than about 15 may cause twisting or collapsing of the multilayer stack 204 in subsequent processing.

Figure 10:
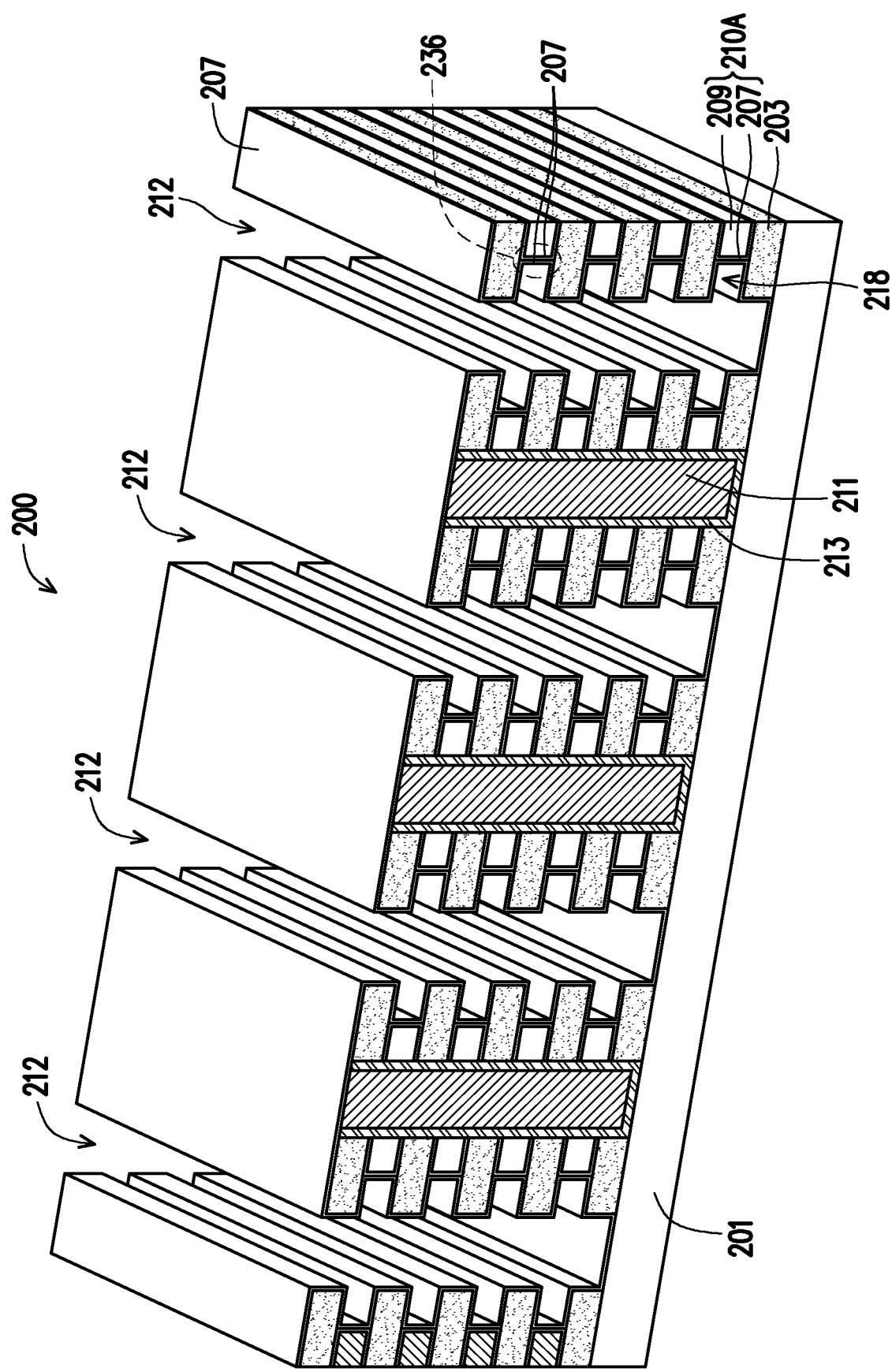

Next, in FIG. 10, the remaining portions of the second dielectric layer 205 are removed, e.g., by performing an etching process using an etchant selective to the material of the second dielectric layers 205. The etching process may be the same as or similar to the etching process used to form the first sidewall recesses 208 discussed above with reference to FIG. 4, thus details are not repeated. After the remaining portions of the second dielectric layer 205 are removed, second sidewall recesses 218 are formed, and there is no more second dielectric layers 205 left in the structure of FIG. 10. Note that the second sidewall recesses exposes the seed layer 207 formed previously along sidewalls of the electrically conductive material 209.

Next, the seed layer 207 is formed (e.g., conformally) over exposed surfaces of the dielectric layer 201, the first dielectric layers 203, and the first conductive structures 210A. The formation method for the seed layer 207 may be the same as or similar to those discussed above with reference to FIG. 5, thus details are not repeated. Note that in regions 236 of FIG. 10, the newly formed seed layer 207 merges with the previously formed seed layer 207, and therefore, the thickness of the (merged) seed layer 207 in the regions 236 (e.g., the portions that extends along sidewalls of the electrically conductive material 209) may be twice the thickness of the seed layer 207 in other regions (e.g., portions along upper surface and lower surface of the electrically conductive material 209).

Figure 11:
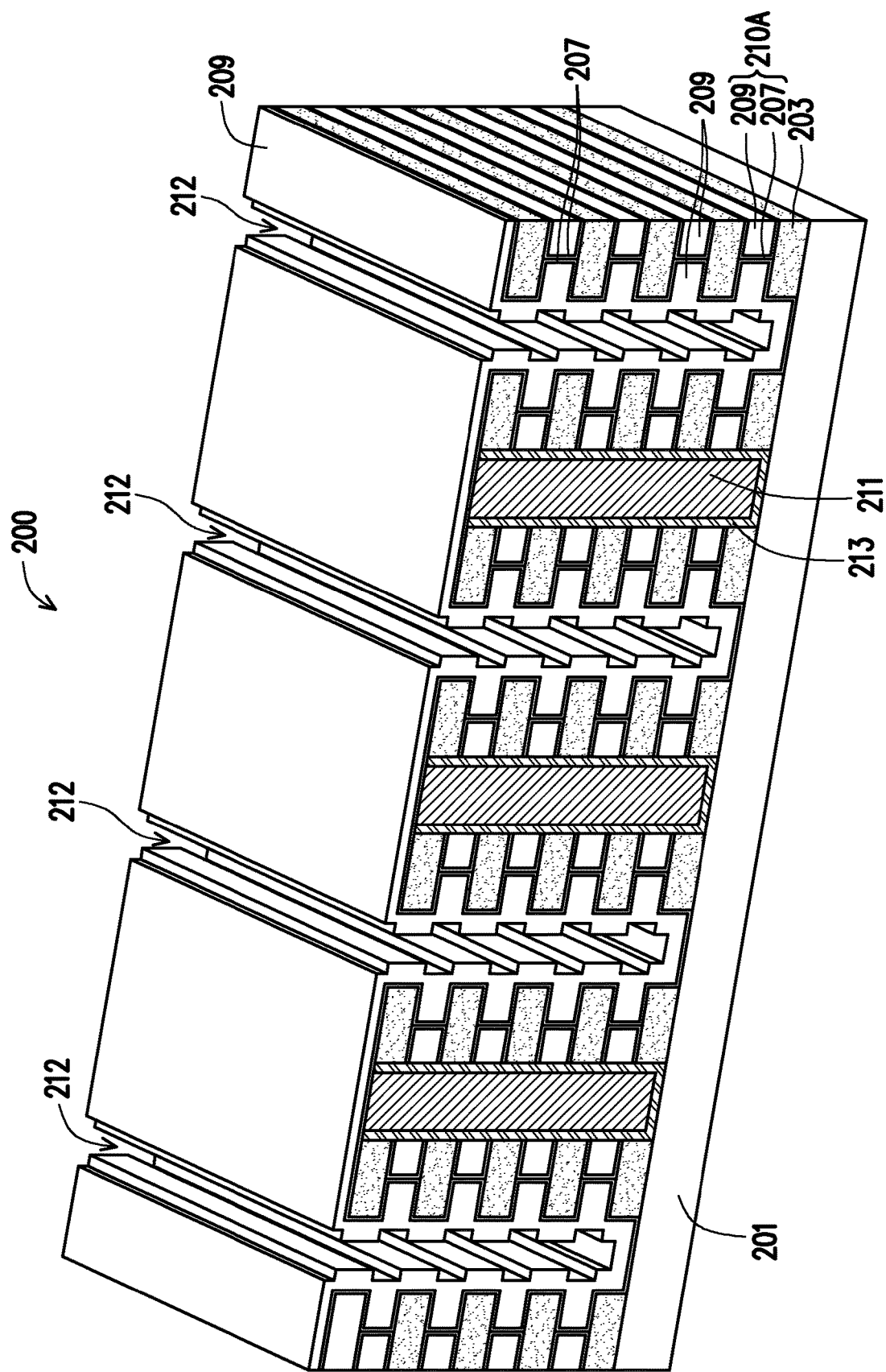

Next, in FIG. 11, the electrically conductive material 209 is formed over the seed layer 207. The electrically conductive material 209 fills the second sidewall recesses 218, in the illustrated embodiment. The material and the formation method for the electrically conductive material 209 may be the same as or similar to those discussed above with reference to FIG. 6, thus details are not repeated.

Figure 12:
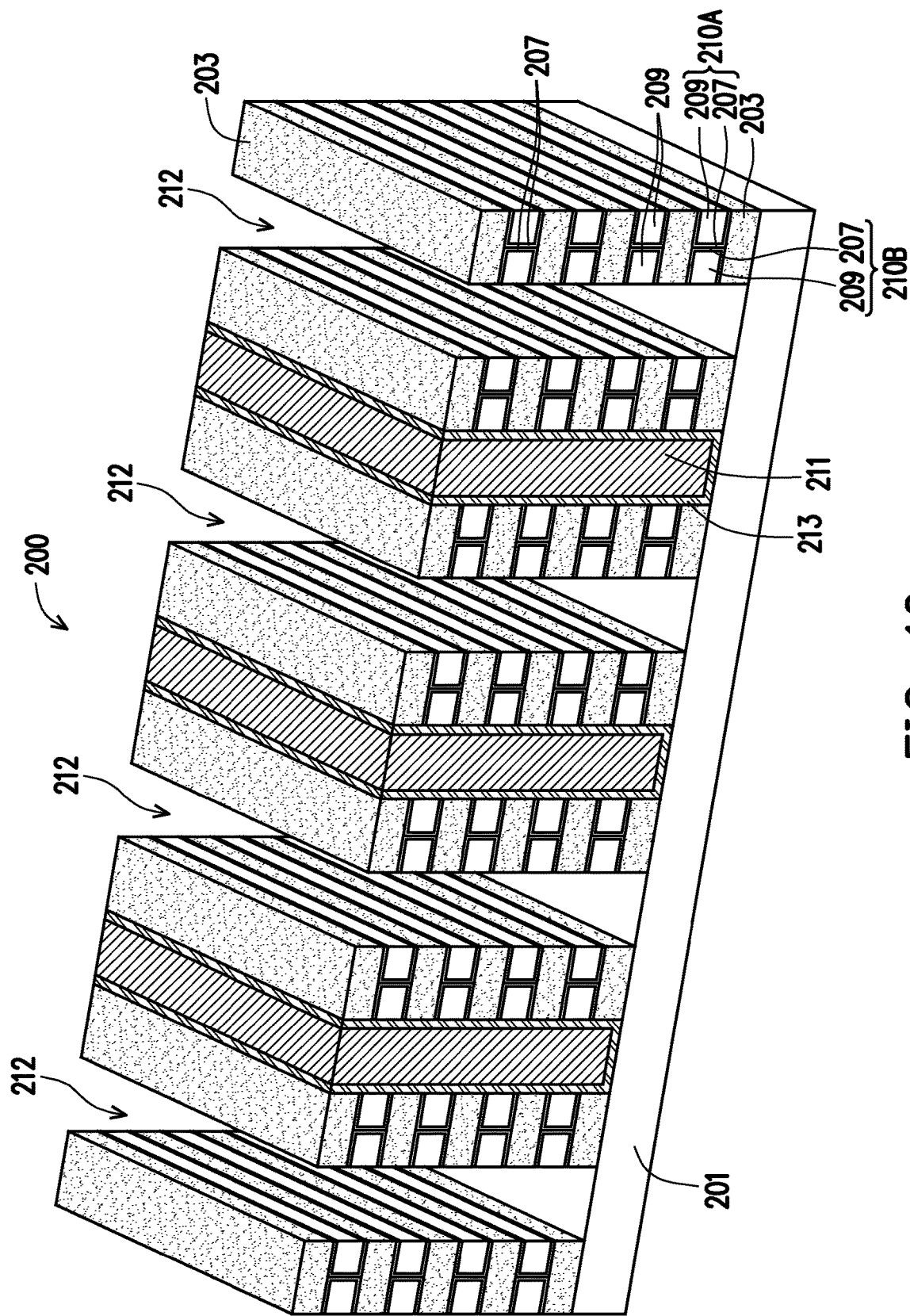

Next, in FIG. 12, a suitable etching process (e.g., an anisotropic etching process) is performed to remove portions of the seed layer 207 and portions of the electrically conductive material 209 disposed outside the second sidewall recesses 218. The etching process may be the same as or similar to the etching process discussed above with reference to FIG. 7, thus details are not repeated. After the etching process, remaining portions of the electrically conductive material 209 and remaining portions of the seed layer 207 (e.g., portions inside the second sidewall recesses 218) form second conductive features 210B, which completes the process for replacing the remaining portions of the second dielectric layers 205 with the second conductive features 210B.

As illustrated in FIG. 12, each of the first conductive features 210A contacts (e.g. physically contacts), and is electrically couple to, a respective second conductive feature 210B. The first conductive features 210A and the second conductive features 210B are collectively referred to as conductive features 210. As will be discussed hereinafter, the conductive features 210 function as the gate electrodes of the FeRAM memory cells (which are transistor with an integrated ferroelectric material). In the context of a memory device, the conductive features 210 are also referred to as the word lines (WLs) 210 of the memory device. In the illustrated embodiment, each pair of a first conductive feature 210A and a second conductive feature 210B (which physically contact each other) functions as a single word line 210.

Figure 13:
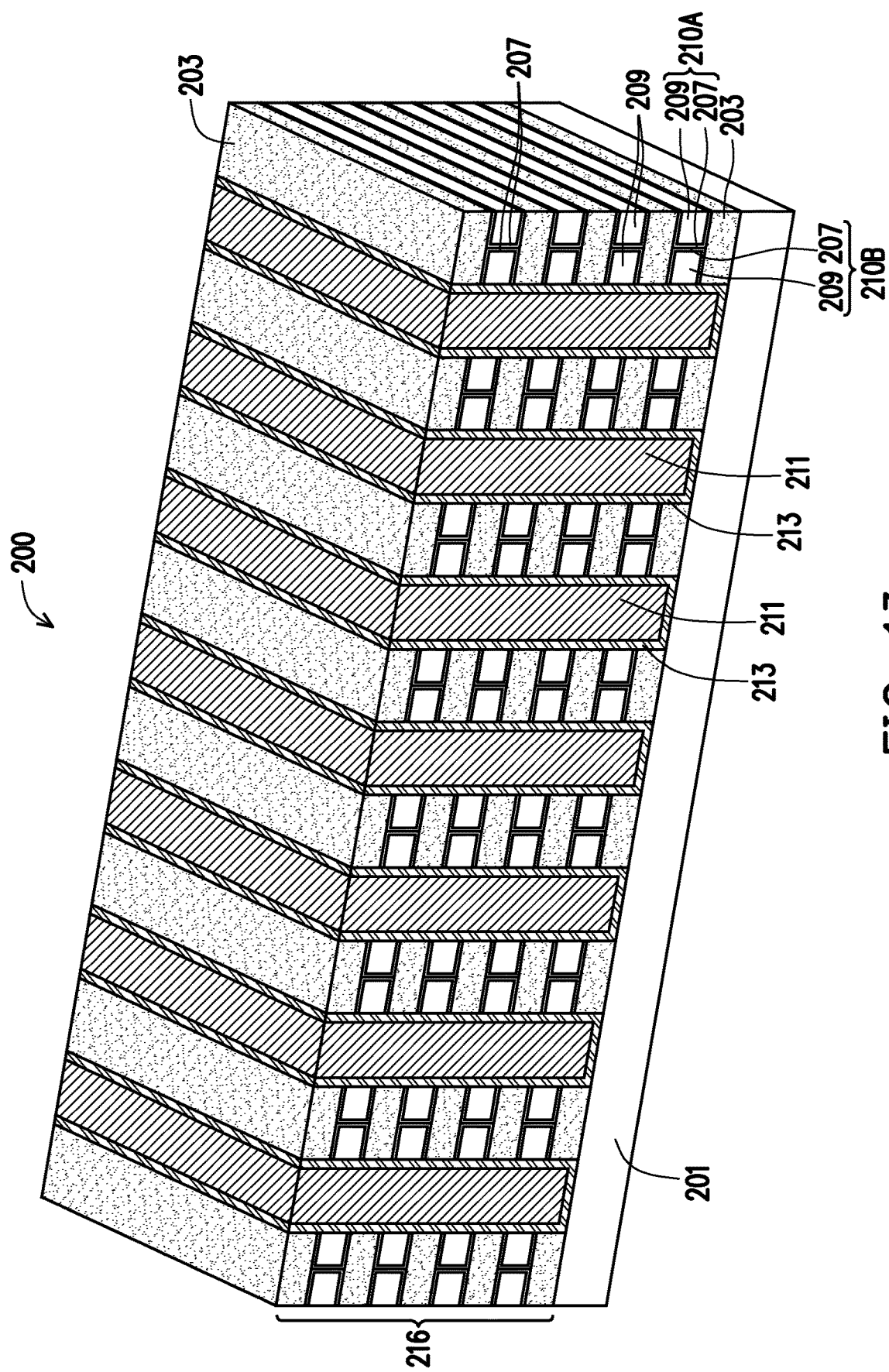

Next, in FIG. 13, the ferroelectric film 213 is formed (e.g., conformally) to line sidewalls and bottoms of the second trenches 212, and the dielectric layer 211 is formed over the ferroelectric film 213 to fill the second trenches 212. The materials and the formation methods for the ferroelectric film 213 and the dielectric layer 211 may be the same as or similar to those discussed above with reference to FIG. 9, thus details are not repeated. Next, a planarization process, such as CMP, may be performed to remove excess portions of the ferroelectric film 213 and excess portions of the dielectric layer 211 from the upper surface of the topmost first dielectric layer 203. As a result, a coplanar upper surface is achieved between the topmost first dielectric layer 203, the ferroelectric film 213, and the dielectric layer 211.

Note that in the structure of FIG. 13, the second dielectric layers 205 in the multilayer stack 204 is replaced by the conductive features 210. To facilitate discussion, the new layer stack, which includes alternating layers of the first dielectric layers 203 and the conductive features 210, are referred to as a multilayer stack 216 (or a layer stack 216).

The structure shown in FIG. 13 is formed by, among other processing steps, forming first trenches 206, filling the first trenches 206, then forming second trenches 212, and filling the second trenches 212. Since the trenches (e.g., 206, 212) define the locations of the memory cells formed subsequently, the above disclosed process allows memory cells to be formed with high density without the issues related with high aspect ratio of the layer stack 204, such as collapsing or twisting of the layer stack. In contrast, a reference method, where all the trenches (e.g., 206, 212) are formed at the same time (e.g., using a same etching process) may not be able to form trenches spaced as close to each other as the disclosed method, because the high aspect ratio of the portions of the layer stack 204 between trenches may cause the layer stack 204 to collapse, thereby causing device failure.

Figure 14:
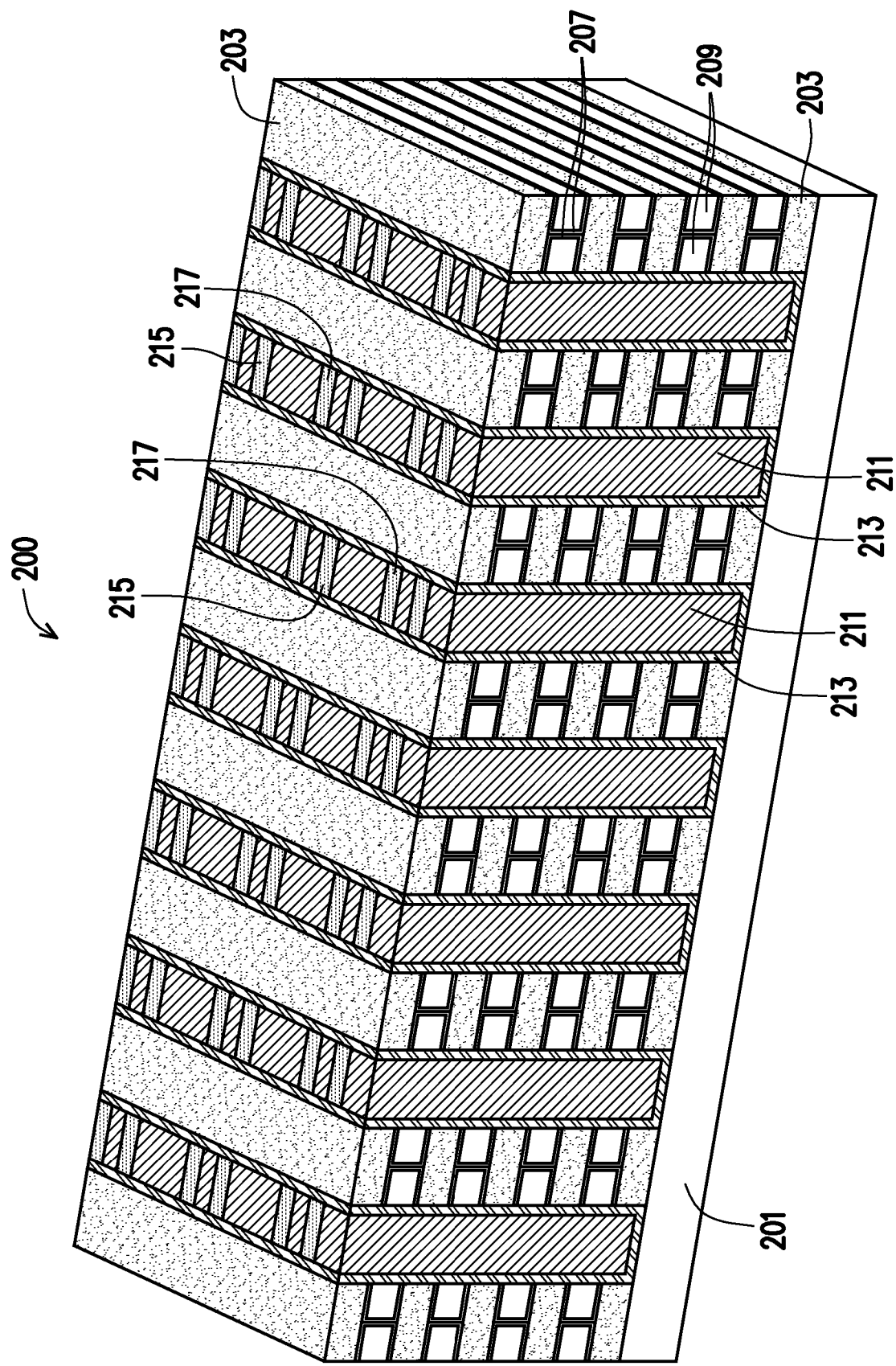

Next, in FIG. 14, bit lines 215 and source lines 217 are formed in the dielectric layer 211. The bit lines 215 and the source lines 217 may be formed as electrically conductive columns (e.g., metal columns) that extend through the dielectric layer 211. As will be discussed hereinafter, the bit lines 215 and the source lines 217 function as the source/drain regions of the transistors of the FeRAM memory cells.

In some embodiments, to form the bit lines 215 and the source lines 217, openings are formed in the dielectric layer 211 at locations where the bits lines 215 and the source lines 217 are to be formed, e.g., using suitable photolithography and etching techniques. The openings are formed to extend through the dielectric layer 211 and the ferroelectric film 213, in some embodiments. In some embodiments, the openings further extend through the dielectric layer 201, which may allow the subsequently formed bit lines 215 and source lines 217 to directly connect to underlying circuits or device. In some embodiments, the openings do not extend through the dielectric layer 201, in which case the bit lines 215 and source lines 217 may be connected to conductive features overlying the memory device (see, e.g., vias 124 and conductive lines 125 over memory devices 123 in FIG. 1), and electrical connection to underlying circuits or devices may be achieved through vias 124 disposed in the dielectric layer 121 adjacent to the memory devices (see, e.g., vias 124 adjacent to memory devices 123 in FIG. 1). Next, one or more conductive materials (e.g., electrically conductive material(s)) are then formed in the openings. Suitable conductive materials include metals such as tungsten, cobalt, aluminum, nickel, copper, silver, gold, alloys thereof, or the like. The conductive material(s) may be formed by an acceptable deposition process such as ALD, CVD, a plating process such as electroplating or electroless plating, or the like. In some embodiments, tungsten is deposited in the openings. A planarization process is then applied to the various layers to remove excess conductive material(s) over the topmost first dielectric layer 203. The planarization process may be a CMP process, an etch-back process, combinations thereof, or the like. The remaining conductive material(s) in the openings form the bit lines 215 and the source lines 217.

Figure 15:
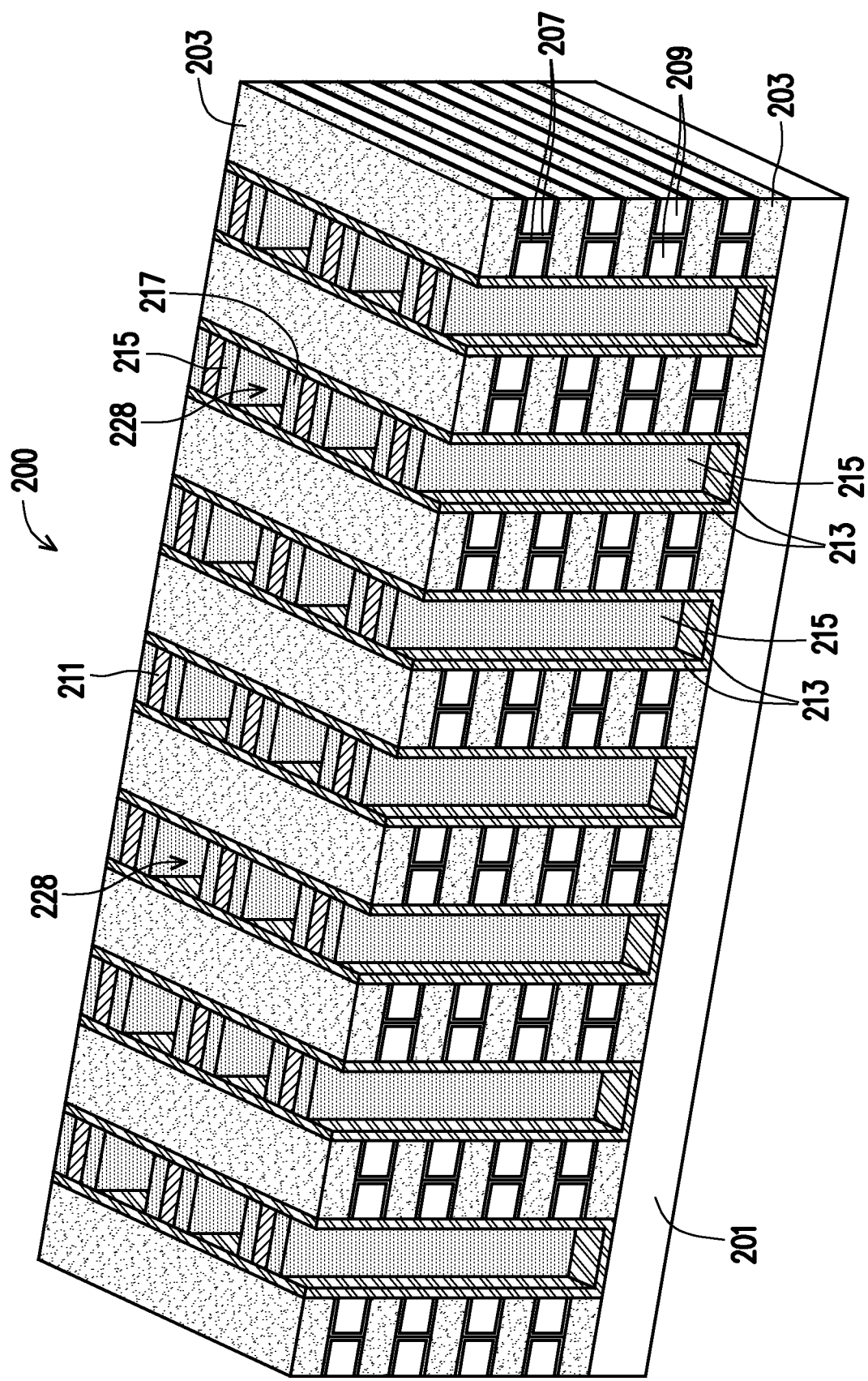

Next, in FIG. 15, openings 228 are formed in the dielectric layer 211 between each pair of bit line 215 and source line 217, by removing portions the dielectric layer 211 disposed between each pair of bit line 215 and source line 217. The remaining portions of the dielectric layer 211 function to separate (e.g., electrically isolate) different memory cells 225 (see, e.g., FIGS. 19B and 19C) formed subsequently. The openings 228 extend through the dielectric layer 211 and expose the underlying ferroelectric film 213. In other words, the openings 228 do not extend through the ferroelectric film 213, in the illustrated embodiment. In other embodiments, the openings 228 extend through the ferroelectric film 213 and expose the underlying dielectric layer 201.

Figure 16:
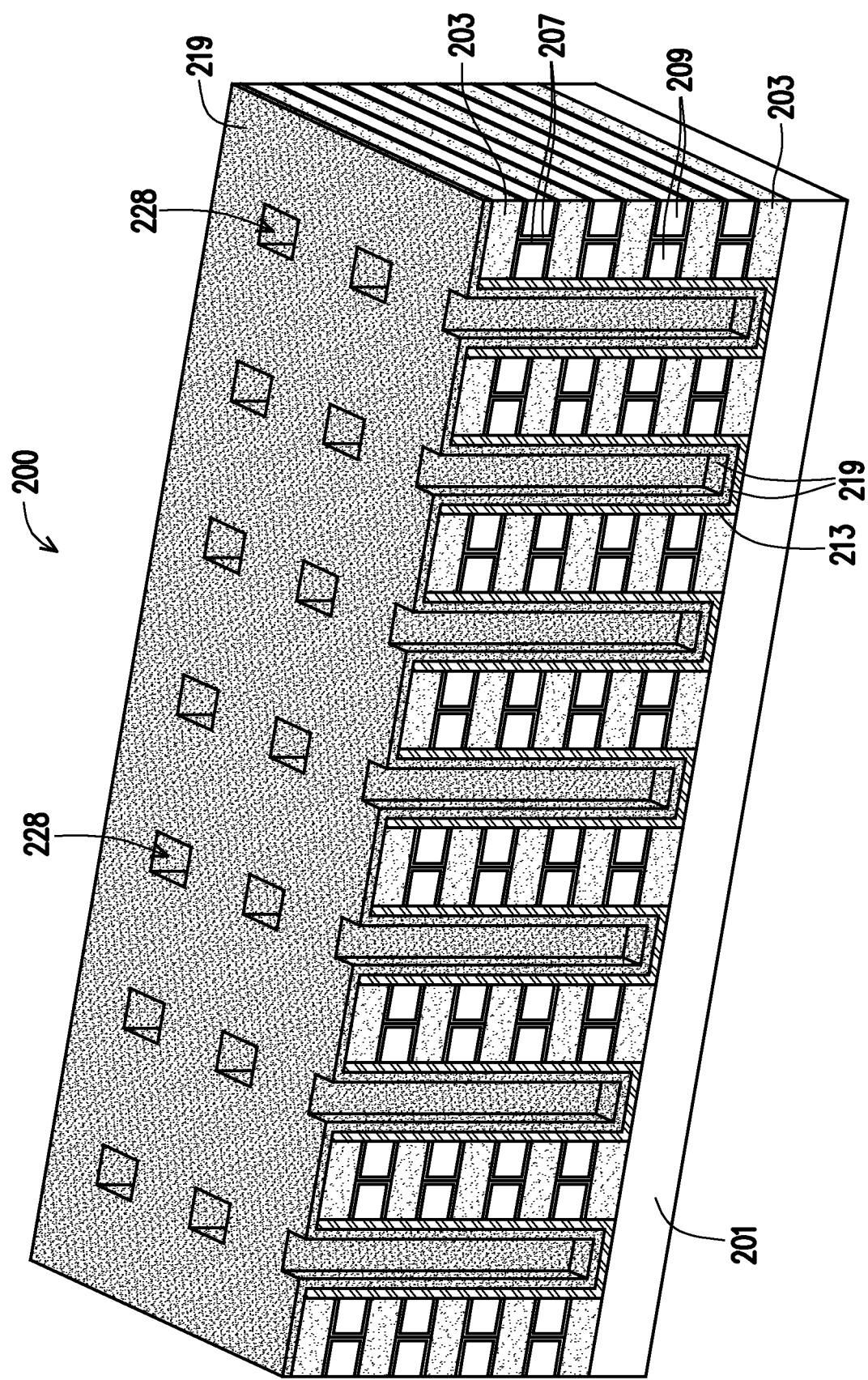

Next, in FIG. 16, a channel material 219 is formed (e.g., conformally) in the openings 228 to line sidewalls and bottom of the openings 228. The channel material 219 is formed of a suitable semiconductor material for providing channel regions for the transistor of the FeRAM cells, such as polysilicon, amorphous silicon, or an oxide semiconductor material such as indium gallium zinc oxide (IGZO), indium tin oxide (ITO), indium gallium zinc tin oxide (IGZTO), zinc oxide (ZnO), or the like. The channel material 219 may be formed by an acceptable deposition process such as ALD, CVD, PVD, or the like.

Figure 17:
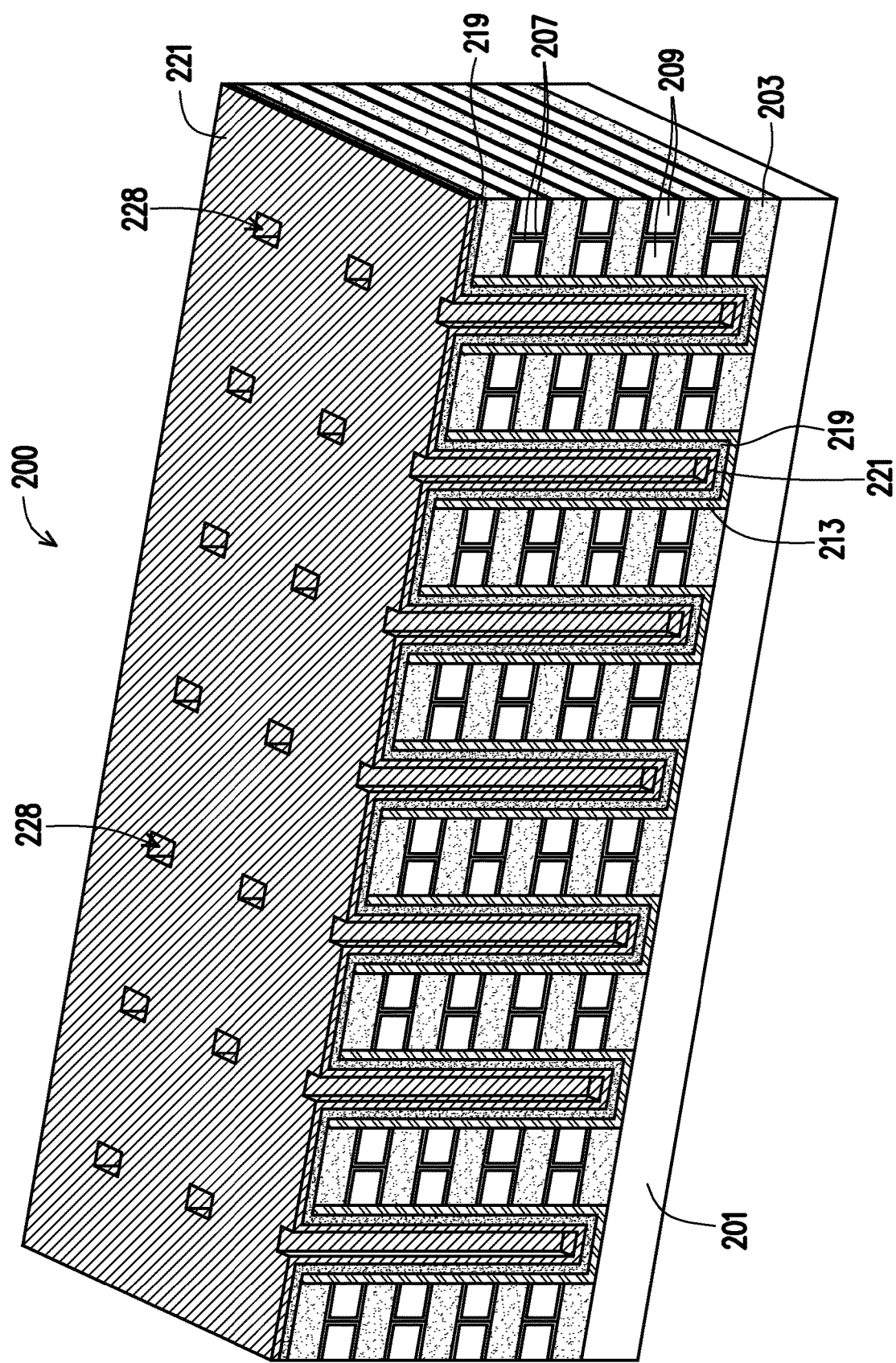

Next, in FIG. 17, an oxide layer 221 is formed (e.g., conformally) in the openings 228 over the channel material 219. The oxide layer 221 functions as a protection layer for the underlying channel material 219, in some embodiments. The oxide layer 221 may be, e.g., aluminum oxide, or silicon dioxide, and may be formed by a suitable formation method such as CVD, ALD, or the like. In the example of FIG. 17, the oxide layer 221 lines the sidewalls and the bottoms of the openings 228. In some embodiments, the oxide layer 221 is omitted.

Figure 18:
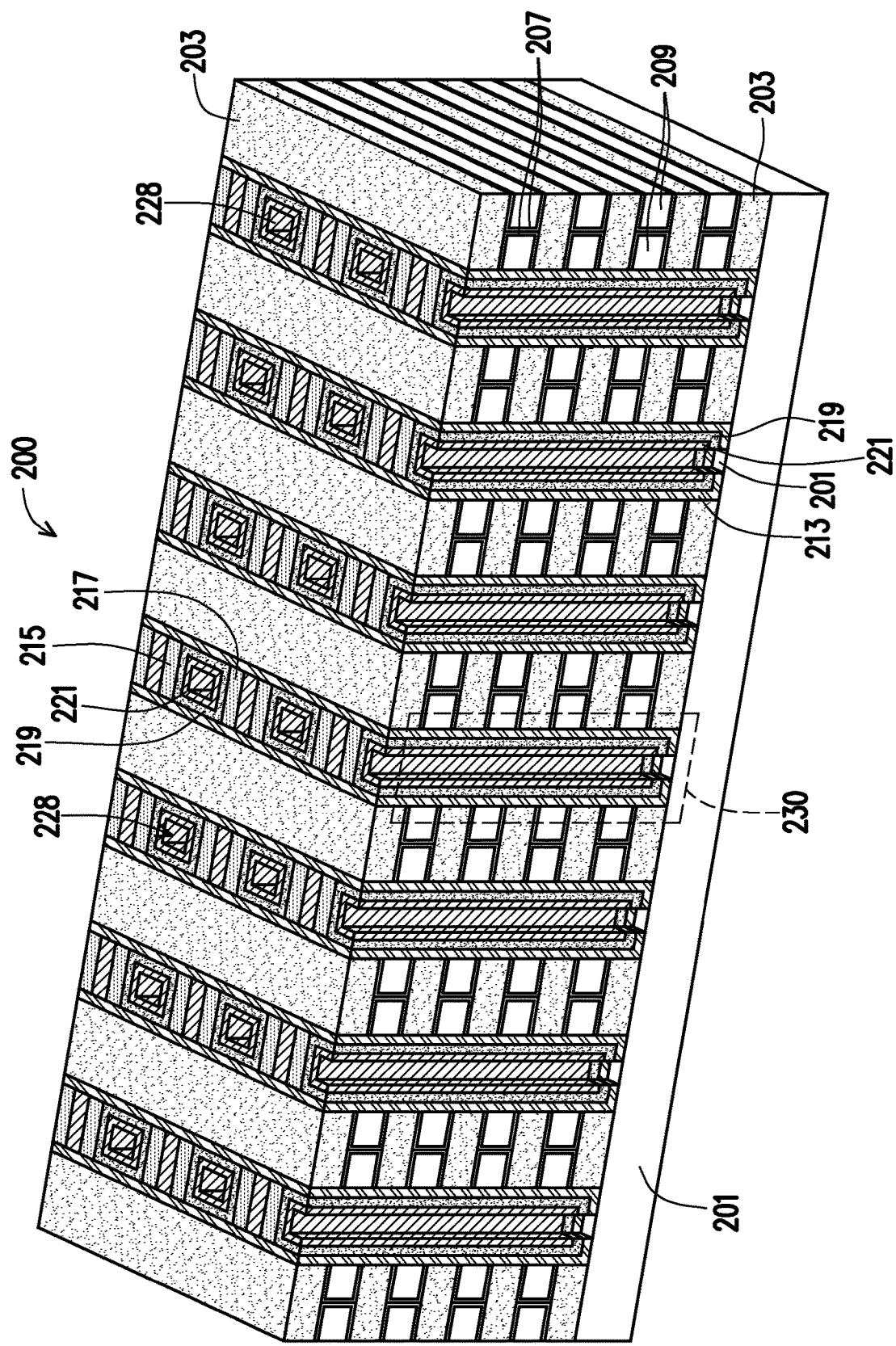

Next, in FIG. 18, an etching process, such as an anisotropic etching process, is performed to remove horizontal portions of the channel material 219 and horizontal portions of the oxide layer 221 (if formed), such as portions disposed at the bottoms of the openings 228 and at the upper surface of the topmost first dielectric layer 203. In the illustrated embodiment, after the etching process, the ferroelectric film 213 at the bottom of the openings 228 are also removed, and the dielectric layer 201 is exposed at the bottoms of the openings 228. In some embodiments, a planarization process, such as CMP, may be performed next to remove remaining portions of the channel material 219 and the oxide layer 221 from the upper surface of the topmost first dielectric layer 203, such that the channel material 219, the oxide layer 221 (if formed), the bit lines 215, the source lines 217, the ferroelectric film 213, the dielectric layer 211, and the topmost first dielectric layer 203 have a coplanar upper surface.

Figure 19A:
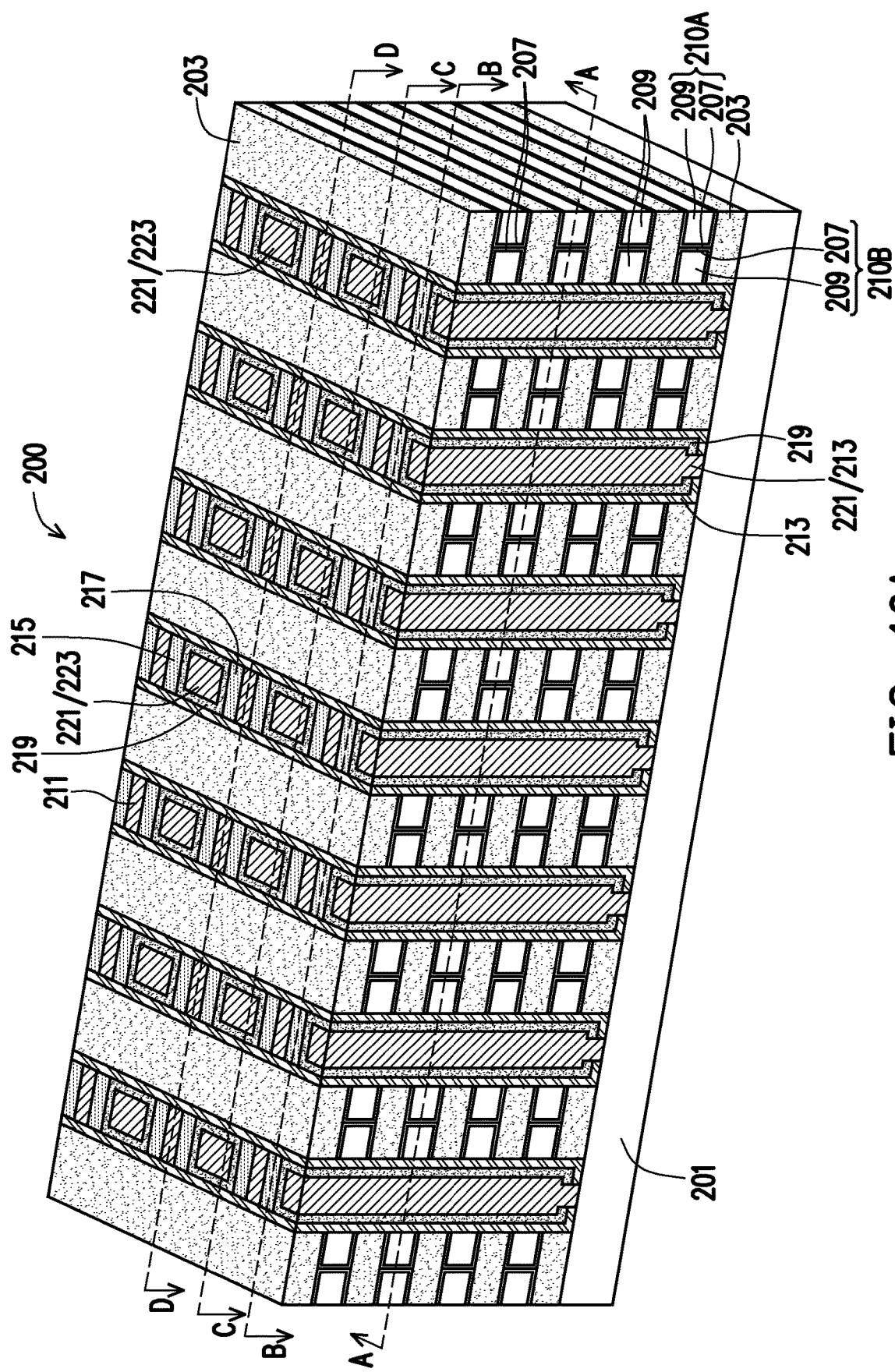

Next, in FIG. 19A, a dielectric material 223 is formed in the openings 228 to fill the openings 228. Suitable dielectric materials include oxides such as silicon oxide; nitrides such as silicon nitride; carbides such as silicon carbide; the like; or combinations thereof such as silicon oxynitride, silicon oxycarbide, silicon carbonitride, or the like. In some embodiments, the dielectric material 223 is formed of a same material as the oxide layer 221, thus there may not be an interface between the dielectric material 223 and the oxide layer 221. For simplicity, subsequent figures may use the numeral 223 to indicate the combination of the oxide layer 221 (if formed) and the dielectric material 223 in the openings 228. The dielectric material 223 may be formed by an acceptable deposition process such as ALD, CVD, or the like. In some embodiments, silicon oxide or silicon nitride is deposited in the openings 228. A planarization process is then performed to remove excess dielectric material 223 disposed over the topmost first dielectric layer 203. The planarization process may be a CMP process, an etch-back process, combinations thereof, or the like. The remaining dielectric material 223 form a plurality of dielectric plugs 223 (may also be referred to as dielectric structures or dielectric columns) in the openings 228.

Figure 19B:
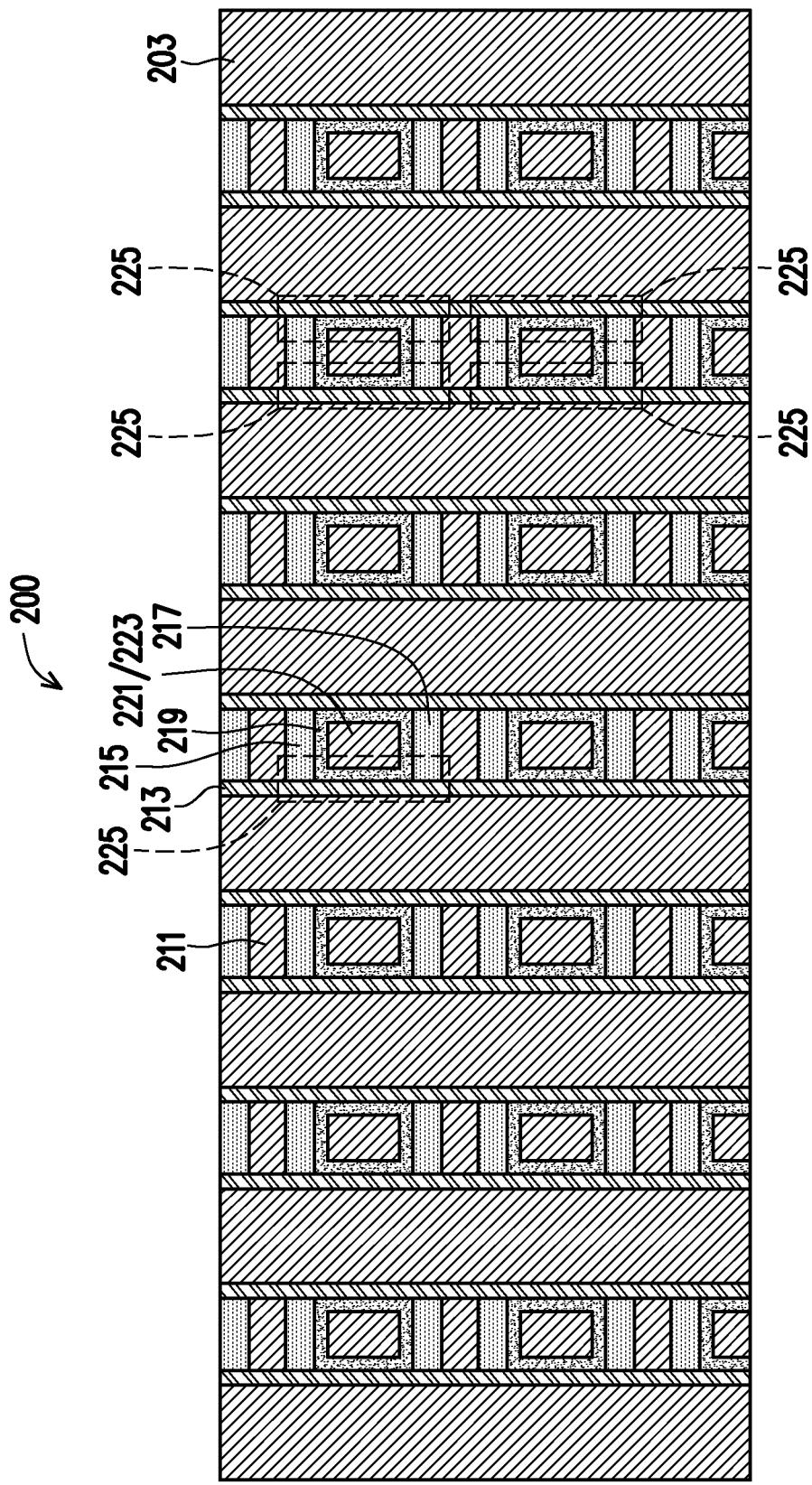

FIG. 19B illustrates a top view of a portion of the 3D memory device 200 of FIG. 19A. As illustrated in the top view of FIG. 19B, inside each trench, the bit lines 215 and the source lines 217 extend continuously from a first sidewall of the ferroelectric film 213 to a second sidewall of the ferroelectric film 213 facing the first sidewall. The channel material 219 encircles each dielectric plug 223. In other words, the channel material 219 extends along and contacts sidewalls of each dielectric plug 223 to form a continuous ring shaped structure around each dielectric plug 223. In FIG. 19B, along the vertical direction, the channel material 219 contacts sidewalls of the bit lines 215/source lines 217, and along the horizontal direction, the channel material 219 contacts sidewalls of the ferroelectric film 213.

The dashed boxes in FIG. 19B mark a plurality of memory cells 225. Note that to avoid cluttering, not all memory cells 225 of the 3D memory device 200 are marked by dashed boxes. Each memory cell 225 includes portions of the following structures/layers/materials within its boundaries: a bit line 215, a source line 217, a dielectric plug 223 disposed between the bit line 215 and the source line 217, the channel material 219 around the dielectric plug 223, the ferroelectric film 213, and the word line 210. Note that the word line 210 is not visible in the top view of FIG. 19B, but is visible in, e.g., FIG. 19C, which illustrates a cross-sectional view of a portion of the 3D memory device 200 along cross-section A-A in FIG. 19A. Note that in FIG. 19B, only a small portion of the 3D memory device 200 is shown, and only portions of the word lines 210, e.g., the electrically conductive material 209, are shown.

Figure 19C:
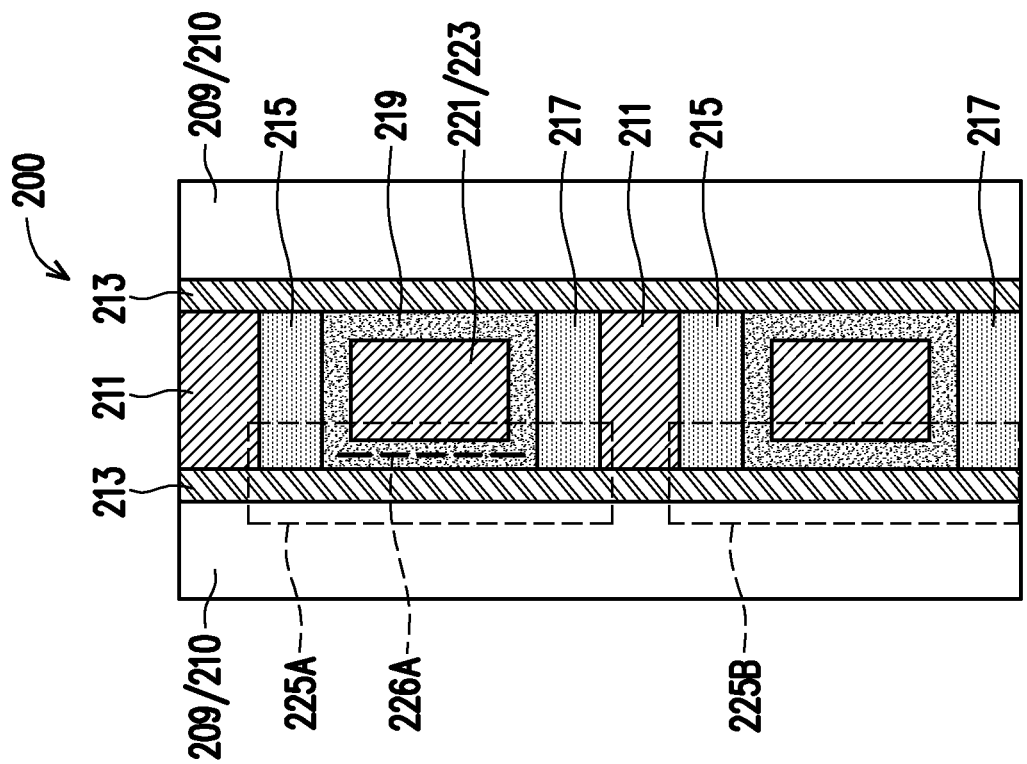

As illustrated in FIGS. 19B and 19C, each memory cell 225 comprises a transistor with a ferroelectric film 213. The word line 210 functions as the gate electrode of the transistor of the memory cell. The bit line 215 and the source line 217 function as the source/drain regions of the transistor of the memory cell. The channel material 219 functions as the channel layer of the transistor. FIG. 19C illustrates an example current flow direction 226 in the channel region when the transistor of the memory cell is turned on. The ferroelectric film 213 is used to store the digital information (e.g., a bit "1" or "0") stored in the memory cell 225.

To perform a write operation on a particular memory cell 225, a write voltage is applied across a portion of the ferroelectric film 213 within the memory cell 225. The write voltage may be applied, for example, by applying a first voltage to the gate electrode (e.g., 210) of the memory cell 225, and applying a second voltage to the source/drain regions (e.g., 215 and 217) of the transistor. The voltage difference between the first voltage and the second voltage sets the polarization direction of the ferroelectric film 213. Depending on the polarization direction of the ferroelectric film 213, the threshold voltage VT of the transistor of the memory cell 225 can be switched from a low threshold voltage VL to a high threshold voltage VH, or vice versa. The threshold voltage value (VL or VH) of the transistor can be used to indicate a bit of "0" or a "1" stored in the memory cell 225.

To perform a read operation on the memory cell 225, a read voltage, which is a voltage between the low threshold voltage VL and the high threshold voltage VH, is applied to the gate electrode (e.g., 210) of the memory cell 225. Depending on the polarization direction of the ferroelectric film 213 (or the threshold voltage VT of the transistor), the transistor of the memory cells 225 may or may not be turned on. As a result, when a voltage is applied, e.g., between the source/drain regions (e.g., 215 and 217), an electrical current may or may not flow between the source/drain regions (e.g., 215 and 217). The electrical current may thus be detected to determine the digital bit stored in the memory cell 225.

Figure 19D:
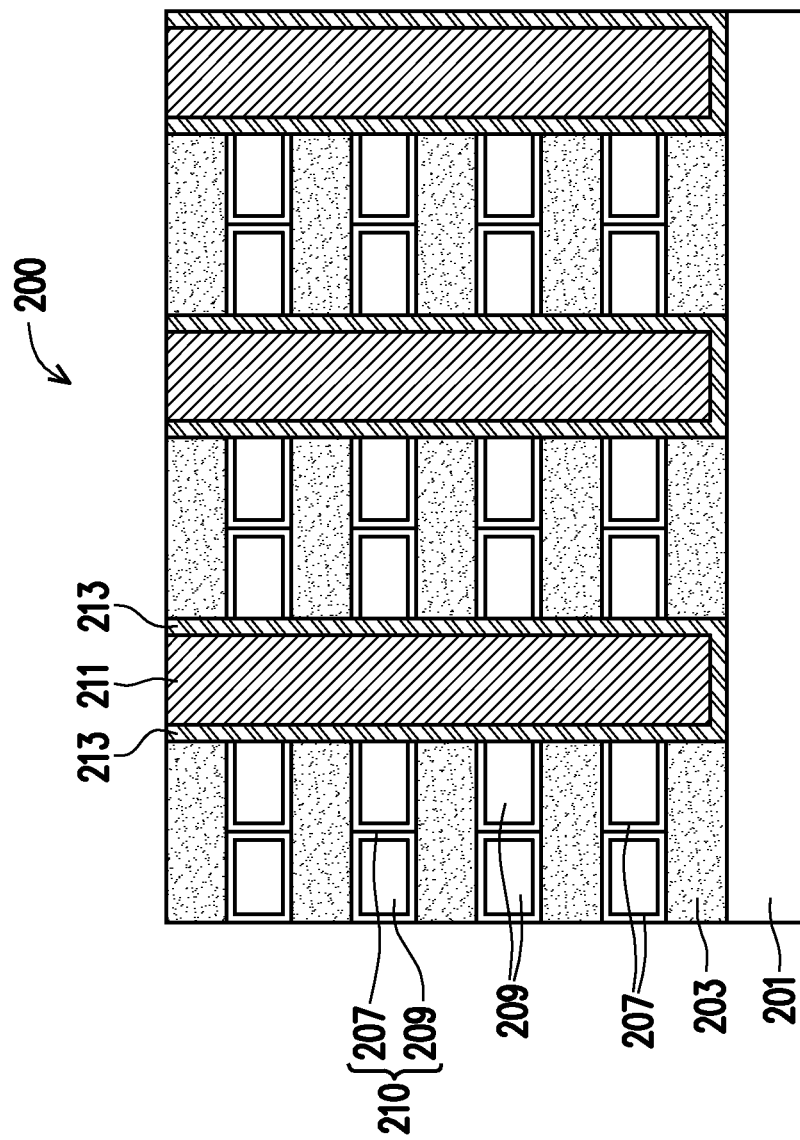
Figure 19E:
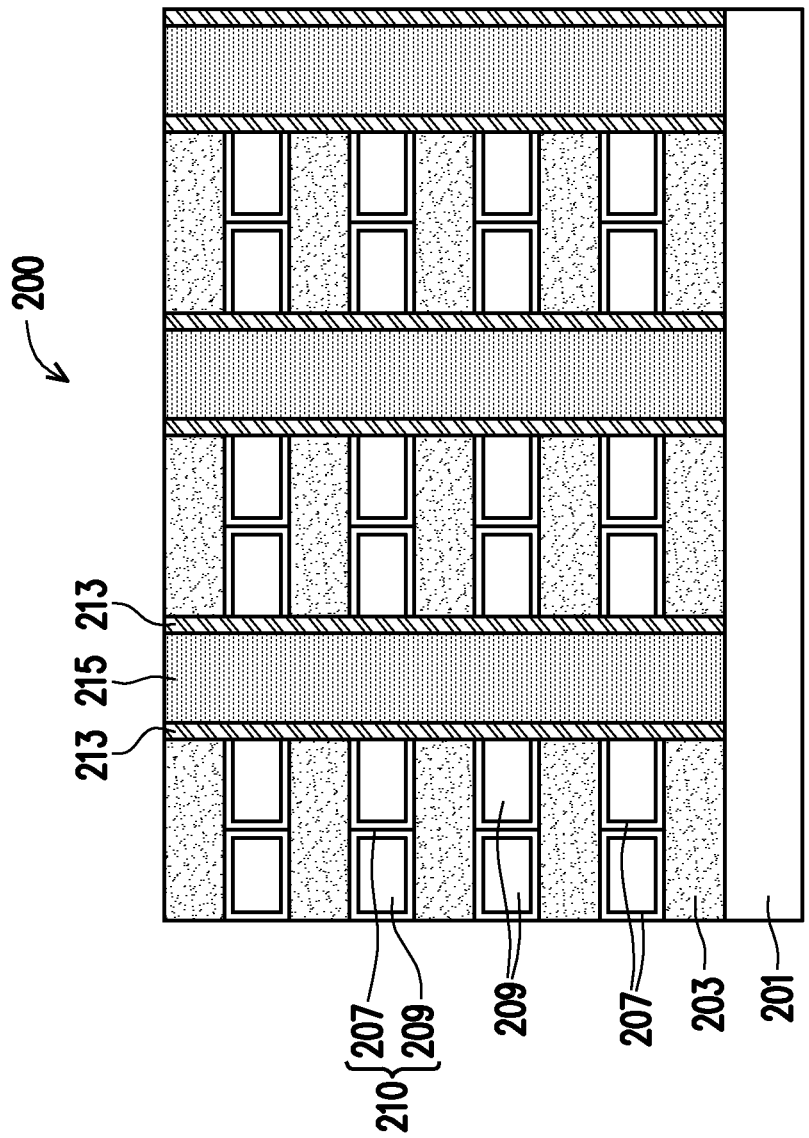
Figure 19F:
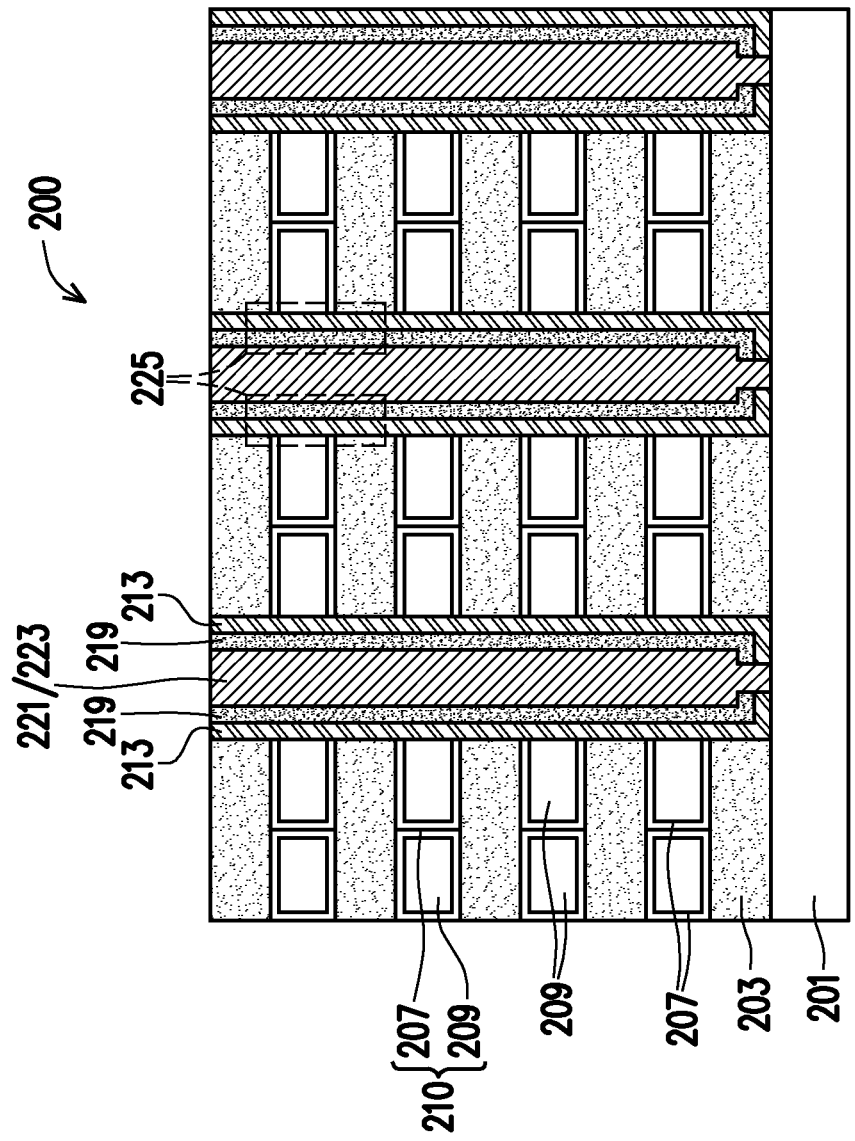

FIG. 19D illustrates a cross-sectional view of a portion of the 3D memory device 200 along cross-section D-D in FIG. 19A. FIG. 19E illustrates a cross-sectional view of a portion of the 3D memory device 200 along cross-section B-B in FIG. 19A. FIG. 19F illustrates a cross-sectional view of a portion of the 3D memory device 200 along cross-section C-C in FIG. 19A. Note that in FIG. 19D, portions of the ferroelectric film 213 under the dielectric layer 211 remain in the 3D memory device formed, and therefore, the ferroelectric film 213 in FIG. 19D has a U-shaped cross-section in each trench. In FIG. 19E, portions of the ferroelectric film 213 under the bit line 215 (or source line 217) are removed by the anisotropic etching process, and therefore, the ferroelectric film 213 in FIG. 19E is shown as having two parallel sidewall portions in each trench. In FIG. 19F, due to the anisotropic etching process in FIG. 18 removing the ferroelectric film 213 at the bottom of the openings 228, there is no ferroelectric film 213 under the dielectric plug 223, and therefore, the ferroelectric film 213 in FIG. 19F is shown as having two parallel sidewall portions in each trench.

In the disclosed embodiment, the channel material 219 is formed after the word lines 210, bit lines 215, and source lines 217 are formed. Therefore, the disclosed formation method is also referred to as a channel-last method for forming 3D memory device. The channel-last method is able to avoid the issue of bit line/source line bridging between adjacent memory cells. To appreciate the advantage of the channel-last method, consider a reference method (referred to as a channel-first method) where the channel material 219 is formed before the bit lines 215 and source lines 217 are formed. For example, in a channel-first method, the channel material 219 is formed conformally over the ferroelectric film 213 before the dielectric layer 211 fills the trenches, such that the channel material 219 is sandwiched between the ferroelectric film 213 and the dielectric layer 211. Next, in the channel-first method, the bits lines 215 and source lines 217 are formed by forming conductive columns in the dielectric layer 211, then cutting each conductive column into two separate (smaller) conductive columns by forming a dielectric cut pattern that bisects each conductive column. The dielectric cut pattern extends continuously between, and contacts, opposing sidewalls of the ferroelectric film 213 in each trench. The dielectric cut pattern cuts the channel material into different segments that belong to different memory cells. The two smaller conductive columns of each original conductive column form a bit line and an adjacent source line in a neighboring memory cell. In the channel-first method, bridging between bit line/source line in neighboring memory cells may occur. For example, the sidewalls of the electrically conductive material 209 may be recessed from the sidewalls of the first dielectric layer 203, e.g., due to over-etching in the processing step of FIG. 7 or FIG. 12. The subsequently formed (e.g., conformally) ferroelectric film 213 and channel material 219 will fill these recesses. The portions of the channel material 219 in these recesses may be difficult to remove during the subsequent processing to form the dielectric cut pattern. Therefore, the channel material 219 in these recesses may electrically couple bit line/source line in neighboring memory cells. In contrast, the channel-last method, by forming the channel material 219 after the bit lines 215 and source lines 217 are formed, avoids the bit line/source line bridging issue.

Additional advantages of the present disclosed method includes lower contact resistance for the bit lines 215 and source lines 217, due to larger contact area with the channel material 219. In addition, formation of the channel material 219 is simple, and no extra hard mask is needed. Furthermore, since etching hard masks may need a high-temperature processing (e.g., higher than 500° C.), and since the presently disclosed method does not need etching of a hard mask for forming the channel material 219, thermal impact on the channel material 219 is reduced, which improves the electrical property of the channel material 219.

Additional processing may follow the processing of FIG. 19A to complete the 3D memory device 200. For example, contact plugs may be formed to electrically couple to the bit lines 215, source lines 217, and word lines 210. Any suitable formation method for forming the contact plugs may be used. Details are not discussed here.

Figure 20:
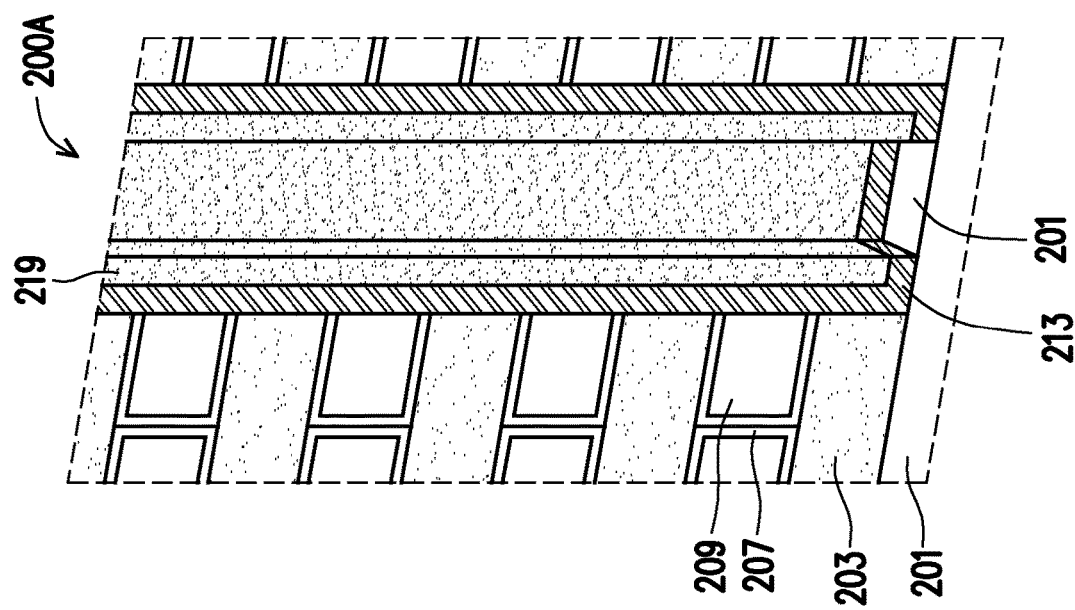
FIGS. 20 and 21 illustrate cross-sectional views of a three-dimensional (3D) ferroelectric random access memory (FeRAM) device at various stages of manufacturing, in another embodiment.
Figure 21:
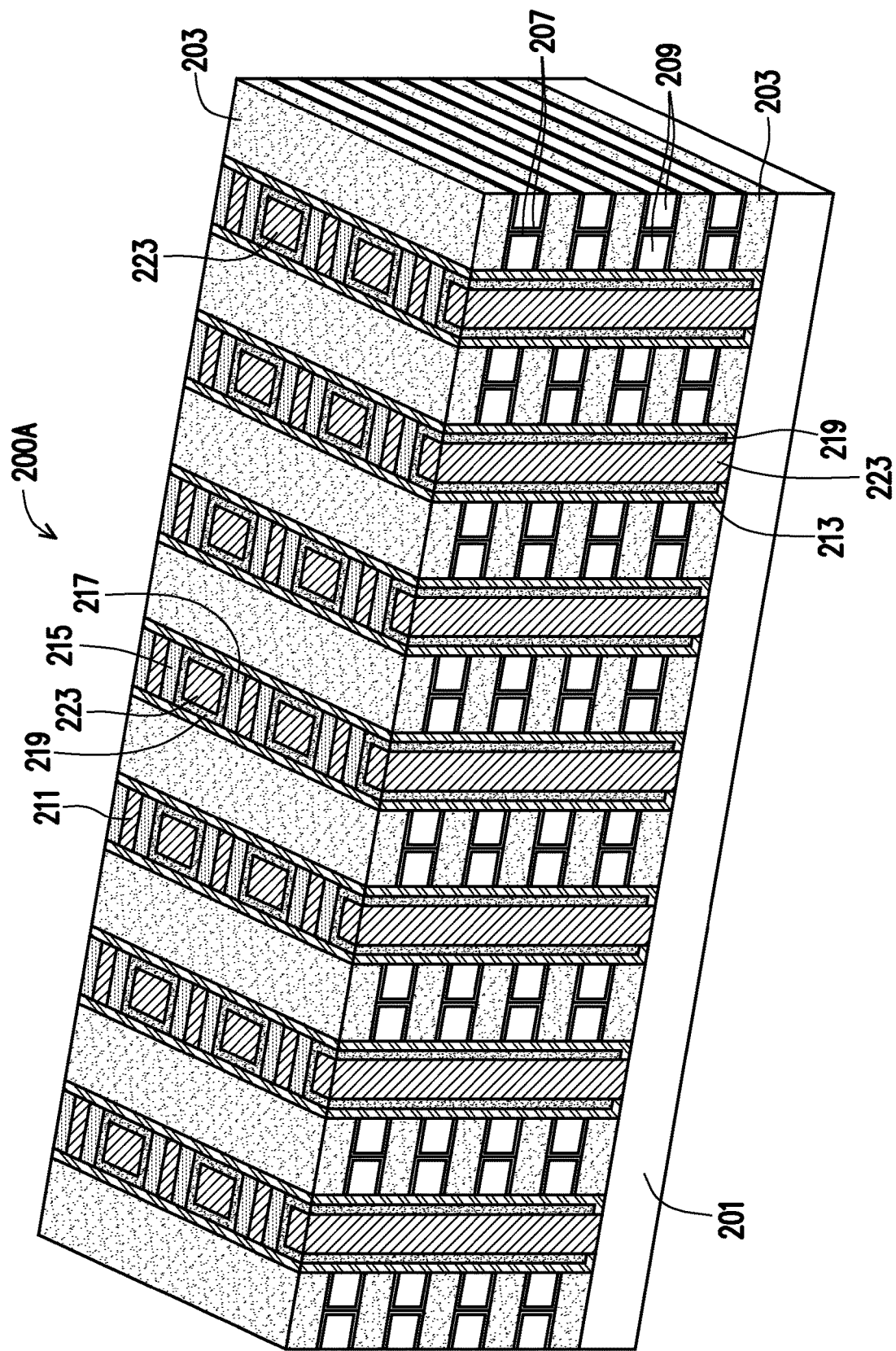

FIGS. 20 and 21 illustrate cross-sectional views of a three-dimensional (3D) ferroelectric random access memory (FeRAM) device 200A at various stages of manufacturing, in another embodiment. The formation process of the 3D memory device 200A is similar to that of the 3D memory device 200, but without the oxide layer 221 formed over the channel material 219. In particular, the formation process for the 3D memory device 200A may follow the processing illustrated in FIGS. 2-16. After the processing of FIG. 16, a suitable etching process, such as an anisotropic etching process, is performed to remove portions of the channel material 219 from the bottom of the openings 228, as shown in FIG. 20. Note that FIG. 20 only shows a portion of the 3D memory device 200A to illustrate details near the bottom of the opening 228. In the example of FIG. 20, the anisotropic etching process etches through the ferroelectric film 213 to expose the underlying dielectric layer 201.

Next, in FIG. 21, the dielectric material 223 is formed to fill the openings 228. The material and formation method for the dielectric material 223 is the same as or similar to those discussed above with reference to FIG. 19A, thus details are not repeated.

Figure 22:
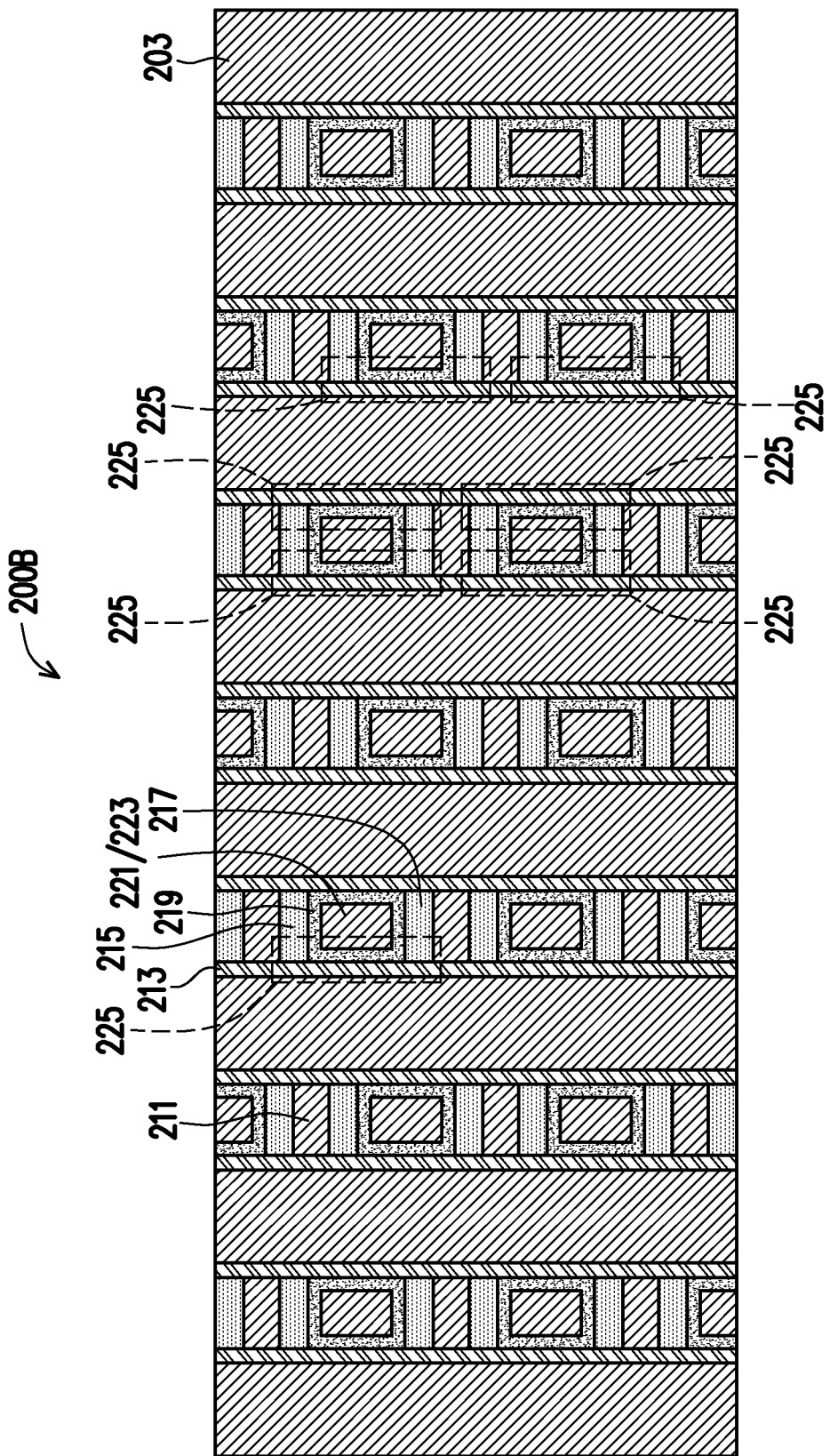
FIG. 22 illustrates a top view of a three-dimensional (3D) ferroelectric random access memory (FeRAM) device, in yet another embodiment.

FIG. 22 illustrates a top view of a three-dimensional (3D) ferroelectric random access memory (FeRAM) device 200B, in yet another embodiment. The 3D memory device 200B is similar to the 3D memory devices 200 or 200A, but the memory cells 225 of the 3D memory device 200B in different trenches are staggered, such that the memory cells 225 in neighboring trenches (e.g., neighboring columns in FIG. 22) are disposed along different rows. In contrast, the memory cells 225 in neighboring columns in FIG. 19B are disposed along the same rows. Note that the layout of the memory cells 225 in FIG. 200B may be used to modify the 3D memory device 200 or the 3D memory device 200A.

Figure 23:
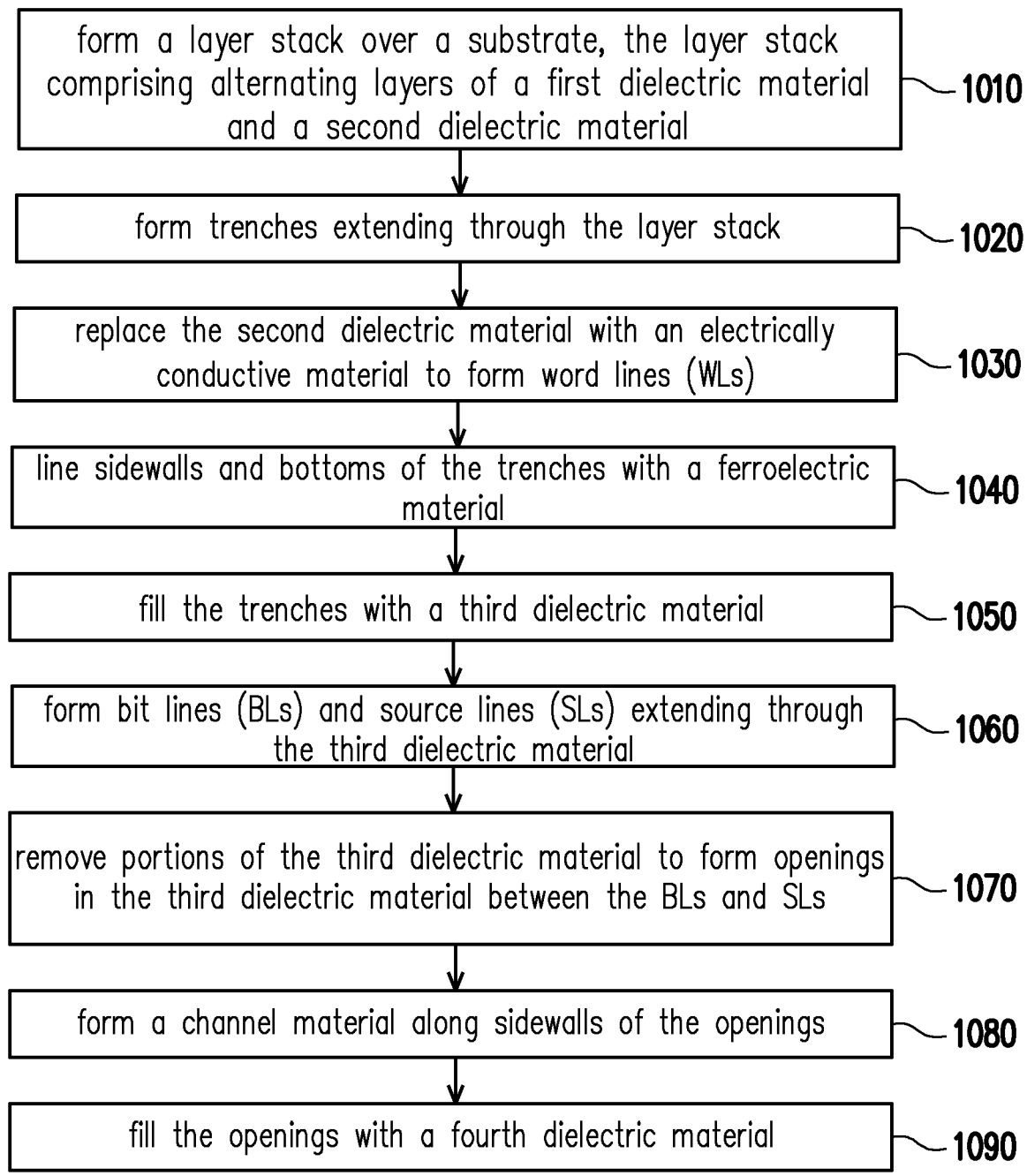
FIG. 23 illustrates a flow chart of a method of forming a three-dimensional (3D) memory device, in some embodiments.

FIG. 23 illustrates a method of forming a three-dimensional (3D) ferroelectric random access memory (FeRAM) device, in some embodiments. It should be understood that the embodiment method shown in FIG. 23 is merely an example of many possible embodiment methods. One of ordinary skill in the art would recognize many variations, alternatives, and modifications. For example, various steps as illustrated in FIG. 23 may be added, removed, replaced, rearranged, or repeated.

Referring to FIG. 23, at block 1010, a layer stack is formed over a substrate, the layer stack comprising alternating layers of a first dielectric material and a second dielectric material. At block 1020, trenches are formed extending through the layer stack. At block 1030, the second dielectric material is replaced with an electrically conductive material to form word lines (WLs). At block 1040, sidewalls and bottoms of the trenches are lined with a ferroelectric material. At block 1050, the trenches are filled with a third dielectric material. At block 1060, bit lines (BLs) and source lines (SLs) are formed extending through the third dielectric material. At block 1070, portions of the third dielectric material are removed to form openings in the third dielectric material between the BLs and the SLs. At block 1080, a channel material is formed along sidewalls of the openings. At block 1090, the openings are filled with a fourth dielectric material.

Embodiments may achieve advantages. For example, by forming first trenches 206 and the second trenches 212 in different processing steps, memory arrays with high memory cell densities can be formed without the issue of layer stack 204 collapsing due to high aspect ratio. The disclosed channel-last process avoids the BL/SL bridging issue, thereby increasing device reliability. In addition, due to larger contact areas between the BL/SL and the channel material, lower BL/SL contact resistance is achieved, thereby increasing device performance. The disclosed channel-last process is simple to implement, and no extra hard mask is required. As a result, there is reduced thermal impact on the channel material, which improves the electrical property of the channel material.

In accordance with an embodiment, a method of forming a three-dimensional (3D) memory device includes: forming a layer stack over a substrate, the layer stack comprising alternating layers of a first dielectric material and a second dielectric material; forming first trenches extending through the layer stack, the first trenches exposing first sidewalls of the first dielectric material and second sidewalls of the second dielectric material; recessing the second sidewalls of the second dielectric material from the first sidewalls of the first dielectric material to form first recesses; filling the first recesses with a first electrically conductive material to form word lines (WLs); lining sidewalls and bottoms of the first trenches with a ferroelectric material after filling the first recesses; filling the first trenches with a third dielectric material after the lining; forming a first bit line (BL) and a first source line (SL) in the third dielectric material in one of the first trenches, wherein the first BL and the first SL extend vertically through the third dielectric material from a lower surface of the third dielectric material facing the substrate to an upper surface of the third dielectric material distal from the substrate; removing portions of the third dielectric material disposed between the first BL and the first SL to form a first opening in the third dielectric material; forming a channel material along sidewalls of the first opening; and filling the first opening with a fourth dielectric material.

In accordance with an embodiment, a method of forming a three-dimensional (3D) memory device includes: forming a layer stack over a substrate, the layer stack comprising alternating layers of a first dielectric material and a second dielectric material; forming trenches extending through the layer stack; replacing the second dielectric material with an electrically conductive material to form word lines (WLs); lining sidewalls and bottoms of the trenches with a ferroelectric material; filling the trenches with a third dielectric material; forming bit lines (BLs) and source lines (SLs) extending vertically through the third dielectric material; removing portions of the third dielectric material to form openings in the third dielectric material between the BLs and the SLs; forming a channel material along sidewalls of the openings; and filling the openings with a fourth dielectric material.

In accordance with an embodiment, a semiconductor device includes: a substrate; a layer stack over the substrate, wherein the layer stack comprises a plurality of dielectric layers and a plurality of word lines (WLs) interleaved with the plurality of dielectric layers; a dielectric structure embedded in the layer stack and extending vertically through the layer stack from a lower surface of the layer stack facing the substrate to an upper surface of the layer stack distal from the substrate; a channel material encircling and contacting sidewalls of the dielectric structure; a bit line (BL) and a source line (SL) that extend vertically through the layer stack, wherein the BL extends along and contacts a first sidewall of the channel material, wherein the SL extends along and contacts a second sidewall of the channel material opposing the first sidewall; and a ferroelectric material extending vertically through the layer stack, wherein a first portion of the ferroelectric material extends along and contacts a third sidewall of the channel material, wherein a second portion of the ferroelectric material extends along and contacts a fourth sidewall of the channel material opposing the third sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a layer stack over the substrate, wherein the layer stack comprises a plurality of dielectric layers and a plurality of word lines (WLs) interleaved with the plurality of dielectric layers;
   a dielectric structure embedded in the layer stack and extending vertically through the layer stack from a lower surface of the layer stack facing the substrate to an upper surface of the layer stack distal from the substrate;
   a channel material encircling and contacting sidewalls of the dielectric structure;
   a bit line (BL) and a source line (SL) that extend vertically through the layer stack, wherein the BL extends along and contacts a first sidewall of the channel material, wherein the SL extends along and contacts a second sidewall of the channel material opposing the first sidewall; and
   a ferroelectric material extending vertically through the layer stack, wherein a first portion of the ferroelectric material extends along and contacts a third sidewall of the channel material, wherein a second portion of the ferroelectric material extends along and contacts a fourth sidewall of the channel material opposing the third sidewall.

2. The semiconductor device of claim 1, wherein in a top view, the BL and the SL extend continuously from the first portion of the ferroelectric material to the second portion of the ferroelectric material.

3. The semiconductor device of claim 1, wherein a third portion of the ferroelectric material extends along a major upper surface of the substrate.

4. The semiconductor device of claim 3, wherein the third portion of the ferroelectric material is disposed between the channel material and the substrate.

5. The semiconductor device of claim 1, wherein the dielectric structure has a first portion proximate to the substrate and a second portion over the first portion, wherein the second portion of the dielectric structure is wider than the first portion of the dielectric structure.

6. The semiconductor device of claim 5, wherein the channel material extends along a lower surface of the second portion of the dielectric structure facing the substrate.

7. The semiconductor device of claim 6, wherein the ferroelectric material extends along a lower surface of the channel material facing the substrate.

8. The semiconductor device of claim 1, wherein a sidewall of the channel material facing the dielectric structure is flush with a sidewall of the ferroelectric material facing the dielectric structure.

9. The semiconductor device of claim 1, further comprising a dielectric material extending vertically from the upper surface of the layer stack toward the lower surface of the layer stack, wherein the dielectric material extends from the first portion of the ferroelectric material to the second portion of the ferroelectric material, and extends along a first sidewall of the BL and a second sidewall of the SL.

10. The semiconductor device of claim 9, wherein the ferroelectric material extends along a lower surface of the dielectric material facing the substrate.

11. A semiconductor device comprising:
a layer stack over a substrate, wherein the layer stack comprises a plurality of dielectric layers interleaved with a plurality of word lines (WLs);
first dielectric plugs extending vertically through the layer stack, wherein in a top view, the first dielectric plugs are aligned in a first column;
second dielectric plugs extending vertically through the layer stack, wherein in the top view, the second dielectric plugs are aligned in a second column parallel to the first column;
a ferroelectric material extending vertically through the layer stack, wherein the first dielectric plugs are disposed between a first portion of the ferroelectric material and a second portion of the ferroelectric material, wherein the second dielectric plugs are disposed between a third portion of the ferroelectric material and a fourth portion of the ferroelectric material;
a channel material around the first dielectric plugs and the second dielectric plugs, wherein the channel material contacts and extends along sidewalls of the first dielectric plugs and sidewalls of the second dielectric plugs, wherein the channel material extends from the first portion of the ferroelectric material to the second portion of the ferroelectric material, and extends from the third portion of the ferroelectric material to the fourth portion of the ferroelectric material;
first bit lines (BLs) and first source lines (SLs) extending vertically through the layer stack and between the first portion of the ferroelectric material and the second portion of the ferroelectric material, wherein the first BLs extend along and contact first sidewalls of the channel material, wherein the first SLs extend along and contact second sidewalls of the channel material opposing the first sidewalls; and
second BLs and second SLs extending vertically through the layer stack and between the third portion of the ferroelectric material and the fourth portion of the ferroelectric material, wherein the second BLs extend along and contact third sidewalls of the channel material, wherein the second SLs extend along and contact fourth sidewalls of the channel material opposing the third sidewalls.

12. The semiconductor device of claim 11, wherein the first sidewalls, the second sidewalls, the third sidewalls, and the fourth sidewalls of the channel material are parallel to each other.

13. The semiconductor device of claim 11, wherein in the top view, the first dielectric plugs and the second dielectric plugs are aligned in rows and columns that are perpendicular to each other.

14. The semiconductor device of claim 11, wherein in the top view, the first dielectric plugs and the second dielectric plugs are staggered such that the first dielectric plugs are in different rows from the second dielectric plugs.

15. The semiconductor device of claim 11, further comprising a dielectric material extending vertically through the layer stack, wherein a first portion of the dielectric material is disposed between the first portion of the ferroelectric material and the second portion of the ferroelectric material, and separates the first BLs from the first SLs, wherein a second portion of the dielectric material is disposed between the third portion of the ferroelectric material and the fourth portion of the ferroelectric material, and separates the second BLs from the second SLs.

16. The semiconductor device of claim 15, wherein the ferroelectric material has a fifth portion that extends along a bottom surface of the dielectric material facing the substrate.

17. The semiconductor device of claim 11, wherein a WL of the plurality of WLs comprises:
a conductive material; and
a liner material, wherein the liner material comprises:
a first portion extending along an upper surface of the conductive material facing away from the substrate;
a second portion extending along a lower surface of the conductive material facing the substrate; and
a third portion extending through the conductive material from the upper surface of the conductive material to the lower surface of the conductive material, wherein the third portion of the liner material separates the conductive material into separate portions, wherein the third portion of the liner material is thicker than the first portion of the liner material and the second portion of the liner material.

18. A semiconductor device comprising:
a layer stack over a substrate, wherein the layer stack comprises a plurality of dielectric layers and a plurality of conductive features interleaved with the plurality of dielectric layers;
a dielectric plug embedded in the layer stack and extending vertically through the layer stack;
a bit line (BL) and a source line (SL) that extend vertically through the layer stack, wherein the BL and the SL extend along a first sidewall of the dielectric plug and a second opposing sidewall of the dielectric plug, respectively, wherein the BL and the SL are spaced apart from the dielectric plug;
a ferroelectric material extending vertically through the layer stack, wherein a first portion of the ferroelectric material and a second portion of the ferroelectric material extend along a third sidewall of the dielectric plug and a fourth opposing sidewall of the dielectric plug, respectively, wherein the first portion and the second portion of the ferroelectric material are spaced apart from the dielectric plug; and
a channel material encircling and contacting sidewalls of the dielectric plug, wherein the channel material fill gaps between the ferroelectric material and the dielectric plug, between the BL and the dielectric plug, and between the SL and the dielectric plug.

19. The semiconductor device of claim 18, wherein a third portion of the ferroelectric material extends along a lower surface of the dielectric plug facing the substrate.

20. The semiconductor device of claim 18, wherein a conductive feature of the plurality of conductive features comprises:
- a conductive material; and
- a liner material, wherein the liner material comprises:
  - a first portion extending along an upper surface of the conductive material distal from the substrate; and
  - a second portion extending through the conductive material and separating the conductive material into separate portions, wherein the second portion of the liner material is thicker than the first portion of the liner material.

* * * * *